United States Patent
Koizumi et al.

(10) Patent No.: US 8,659,127 B2
(45) Date of Patent: Feb. 25, 2014

(54) WIRING SUBSTRATE, SEMICONDUCTOR DEVICE AND MANUFACTURING METHOD THEREOF

(75) Inventors: Naoyuki Koizumi, Nagano (JP); Akihiko Tateiwa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 13/473,089

(22) Filed: May 16, 2012

(65) Prior Publication Data

US 2012/0313226 A1    Dec. 13, 2012

(30) Foreign Application Priority Data

Jun. 8, 2011 (JP) ................................. 2011-128215

(51) Int. Cl.
*H01L 23/552* (2006.01)

(52) U.S. Cl.
USPC ............. 257/659; 257/E21.502; 257/E23.114

(58) Field of Classification Search
USPC ........................... 257/659, E21.502, E23.114
See application file for complete search history.

(56) References Cited

U.S. PATENT DOCUMENTS

| | | | | |
|---|---|---|---|---|
| 5,653,834 A * | 8/1997 | Azzaro et al. | ...... | 65/60.2 |
| 5,877,550 A * | 3/1999 | Suzuki | ...... | 257/700 |
| 5,949,030 A * | 9/1999 | Fasano et al. | ...... | 174/262 |
| 6,013,588 A * | 1/2000 | Ozaki | ...... | 442/179 |
| 6,507,497 B2 * | 1/2003 | Mashino | ...... | 361/767 |
| 6,876,554 B1 * | 4/2005 | Inagaki et al. | ...... | 361/763 |
| 6,909,054 B2 * | 6/2005 | Sakamoto et al. | ...... | 174/260 |
| 7,239,014 B2 * | 7/2007 | Ogawa et al. | ...... | 257/700 |
| 7,867,828 B2 * | 1/2011 | Jobetto | ...... | 438/126 |
| 7,964,972 B2 * | 6/2011 | Matsui | ...... | 257/774 |
| 8,003,895 B2 * | 8/2011 | Sunohara et al. | ...... | 174/260 |
| 8,130,507 B2 * | 3/2012 | Origuchi et al. | ...... | 361/760 |
| 8,183,465 B2 * | 5/2012 | Suzuki et al. | ...... | 174/260 |
| 8,334,590 B1 * | 12/2012 | Jung et al. | ...... | 257/698 |
| 2002/0011351 A1 * | 1/2002 | Ogawa et al. | ...... | 174/260 |
| 2003/0194835 A1 * | 10/2003 | Kim et al. | ...... | 438/113 |
| 2004/0012935 A1 * | 1/2004 | Tagi et al. | ...... | 361/761 |
| 2004/0056340 A1 * | 3/2004 | Jobetto | ...... | 257/678 |
| 2006/0087045 A1 * | 4/2006 | Yamano et al. | ...... | 257/787 |
| 2006/0171698 A1 * | 8/2006 | Ryu et al. | ...... | 396/114 |
| 2006/0244128 A1 * | 11/2006 | Hayashi et al. | ...... | 257/712 |
| 2008/0169120 A1 * | 7/2008 | Inagaki et al. | ...... | 174/255 |
| 2009/0121341 A1 * | 5/2009 | Oi et al. | ...... | 257/701 |
| 2009/0129037 A1 * | 5/2009 | Yoshino | ...... | 361/761 |
| 2009/0194866 A1 * | 8/2009 | Jobetto | ...... | 257/700 |
| 2009/0243065 A1 * | 10/2009 | Sugino et al. | ...... | 257/686 |
| 2009/0244865 A1 * | 10/2009 | Tanaka | ...... | 361/764 |
| 2009/0308651 A1 * | 12/2009 | Abe et al. | ...... | 174/264 |

(Continued)

FOREIGN PATENT DOCUMENTS

JP       2004-068117       3/2004

*Primary Examiner* — David S Blum
(74) *Attorney, Agent, or Firm* — IPUSA, PLLC

(57) ABSTRACT

A semiconductor device includes a wiring substrate, and a semiconductor chip, wherein the wiring substrate includes a glass plate having an opening portion penetrating through a first surface of the glass plate to a second surface of the glass plate, a resin portion penetrating through the first surface to the second surface, and a through wiring penetrating through the resin portion from the first surface to the second surface to electrically connect a first wiring layer formed on a side of the first surface with a third wiring layer formed on a side of the second surface, wherein the semiconductor chip is accommodated inside the opening portion.

11 Claims, 19 Drawing Sheets

(56) References Cited

U.S. PATENT DOCUMENTS

| | | | |
|---|---|---|---|
| 2009/0309202 A1* | 12/2009 | Hsu et al. | 257/680 |
| 2010/0078205 A1* | 4/2010 | Sakai et al. | 174/260 |
| 2010/0078786 A1* | 4/2010 | Maeda | 257/678 |
| 2010/0326716 A1* | 12/2010 | Zhang et al. | 174/262 |
| 2011/0193203 A1* | 8/2011 | Goto et al. | 257/659 |
| 2011/0260329 A1* | 10/2011 | Seo | 257/774 |
| 2012/0000068 A1* | 1/2012 | Sakamoto et al. | 29/852 |
| 2012/0175754 A1* | 7/2012 | Furutani et al. | 257/668 |
| 2012/0217624 A1* | 8/2012 | Morris et al. | 257/659 |
| 2012/0280374 A1* | 11/2012 | Choi et al. | 257/659 |
| 2012/0313245 A1* | 12/2012 | Horiuchi et al. | 257/758 |

* cited by examiner

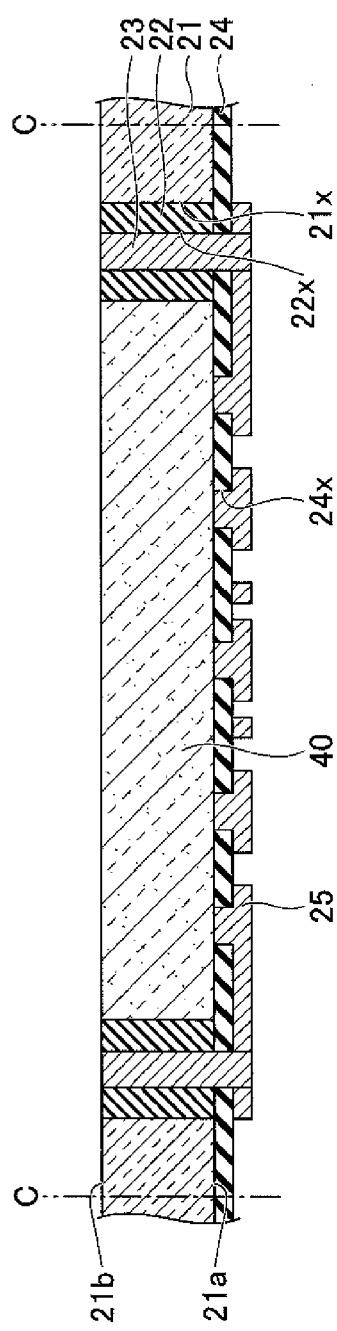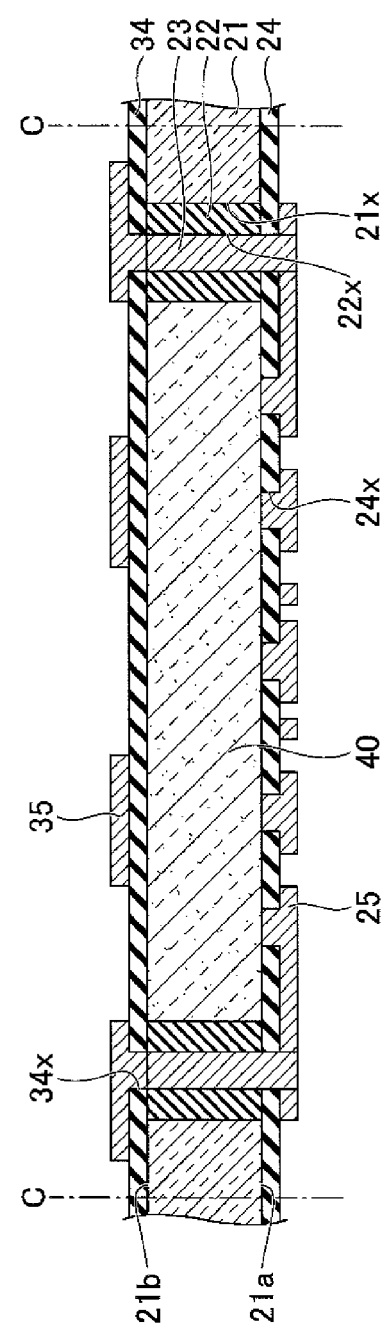

WIRING SUBSTRATE, SEMICONDUCTOR DEVICE AND MANUFACTURING METHOD THEREOF

CROSS-REFERENCE TO RELATED APPLICATIONS

This patent application is based upon and claims the benefit of priority of the prior Japanese Patent Application No. 2011-128215 filed on Jun. 8, 2011, the entire contents of which are incorporated herein by reference.

FIELD

The embodiments discussed herein are related to a semiconductor device including a wiring substrate having a through wiring and a semiconductor chip electrically connected to the wiring substrate, and a manufacturing method of the semiconductor device.

BACKGROUND

Japanese Laid-open Patent Publication No. 2004-68117 discloses a semiconductor device configured such that a semiconductor chip is mounted on a wiring substrate. For example, the wiring substrate is formed by alternately laminating plural wiring layers and plural insulating layers on a substrate body made of silicon and by connecting the neighbor wiring layers via the insulating layer with a via hole penetrating through the insulating layer sandwiched between the neighbor wiring layers. Further, a wiring substrate of which material is changed from silicon to a glass plate may be used.

SUMMARY

According to an aspect of the embodiment, a semiconductor device includes a wiring substrate, and a semiconductor chip, wherein the wiring substrate includes a glass plate having an opening portion penetrating through a first surface of the glass plate to a second surface of the glass plate, a resin portion penetrating through the first surface to the second surface, and a through wiring penetrating through the resin portion from the first surface to the second surface to electrically connect a first wiring layer formed on a side of the first surface with a third wiring layer formed on a side of the second surface, wherein the semiconductor chip is accommodated inside the opening portion.

The object and advantages of the invention will be realized and attained by means of the elements and combinations particularly pointed out in the appended claims.

It is to be understood that'both the foregoing general description and the following detailed description are exemplary and explanatory and are not restrictive of the invention, as claimed.

BRIEF DESCRIPTION OF THE DRAWINGS

FIG. 12 illustrates the manufacturing process of the semiconductor device of the first embodiment;

FIG. 13 illustrates the manufacturing process of the semiconductor device of the first embodiment;

DESCRIPTION OF EMBODIMENTS

As described previously, if wiring substrates having wiring layers are electrically connected via a substrate body which is made of a glass plate and intervening between the wiring substrates, it is necessary to form a through hole in the substrate body made of the glass plate. However, it is difficult to form the through hole in the substrate body made of the glass plate. For example, Patent Document 1 suggests that a through hole is formed in a glass plate by a laser trimming method or a plasma etching method. However, it is difficult to miniaturize the through hole by the laser trimming method or the plasma etching method. Thus, a technique of forming the through hole in the glass plate is not established.

Preferred embodiments of the present invention will be described with reference to accompanying drawings. The same reference symbols may be provided to the corresponding portions in the figures and description of these portions may be omitted.

[a] First Embodiment
(The Structure of a Semiconductor Device of the First Embodiment)

Figure 1:
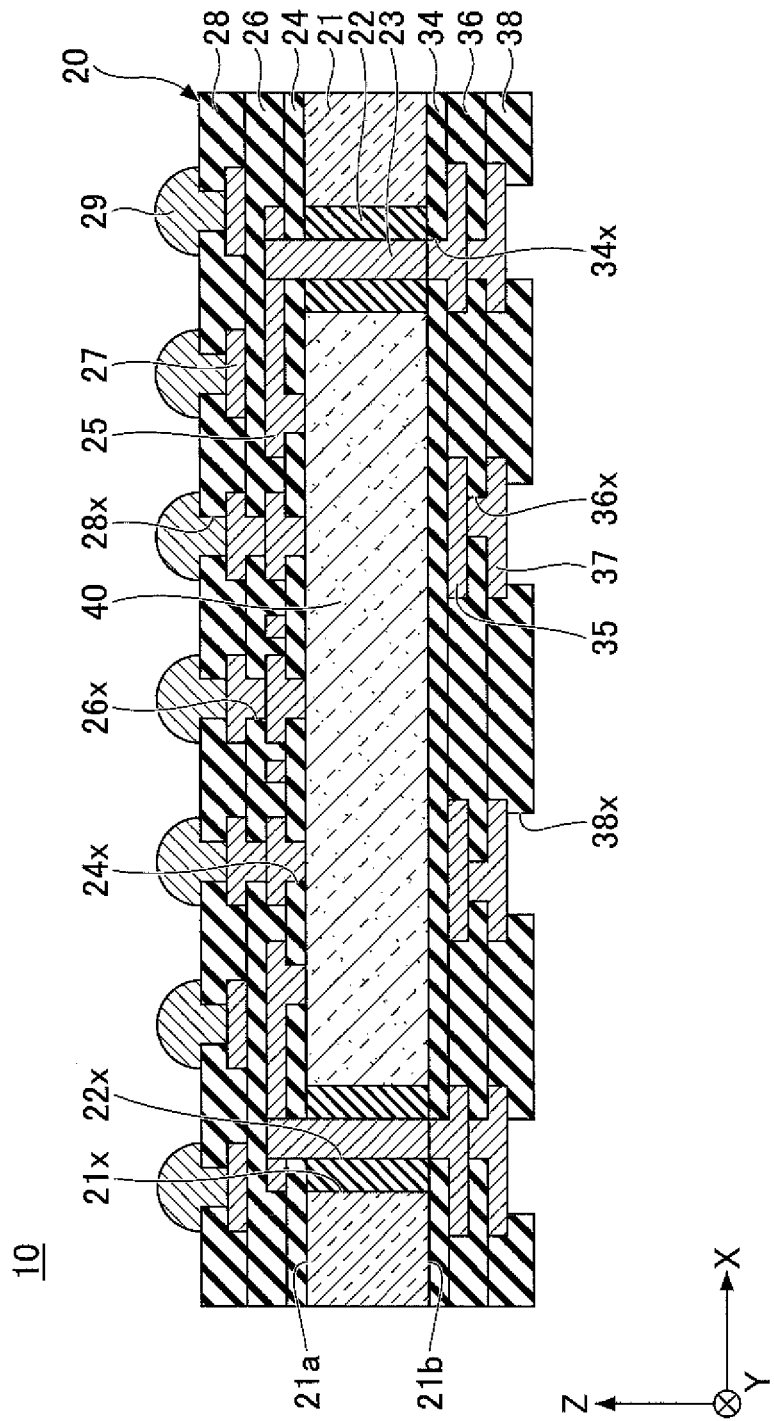
FIG. 1 is a cross-sectional view of a semiconductor device of a first embodiment.

The structure of the semiconductor device of the first embodiment is described. FIG. 1 is a cross-sectional view of the semiconductor device of the first embodiment. Referring to FIG. 1, the semiconductor device 10 includes a wiring substrate 20 and a semiconductor chip 40 accommodated in the wiring substrate 20. For example, the plan view of the semiconductor device 10 is rectangular, and the dimensions of the semiconductor device 10 are a width of about 15 mm (in the X direction), a depth of about 15 mm (in the Y direction), and a thickness of about 1 mm (in the Z direction). Hereinafter, the wiring substrate 20 and the semiconductor chip 40 forming the semiconductor device 10 are described in detail. Meanwhile, the semiconductor chip 40 has a circuit forming surface and a back surface opposite to the circuit forming surface. Referring to FIG. 1, the circuit forming surface may be positioned above the back surface. The back surface is substantially parallel to the circuit forming surface positioned. In the semiconductor chip 40, a surface substantially perpendicular to the circuit forming surface and the back surface may be referred to as a side surface.

The wiring substrate 20 includes a substrate body 21, a resin portion 22, a through wiring 23, a first insulating layer 24, a first wiring layer 25, a second insulating layer 26, a second wiring layer 27, a third insulating layer 28, an outer connecting terminal 29, a fourth insulating layer 34, a third wiring layer 35, a fifth insulating layer 36, a fourth wiring layer 37 and a sixth insulating layer 38.

Figure 2:
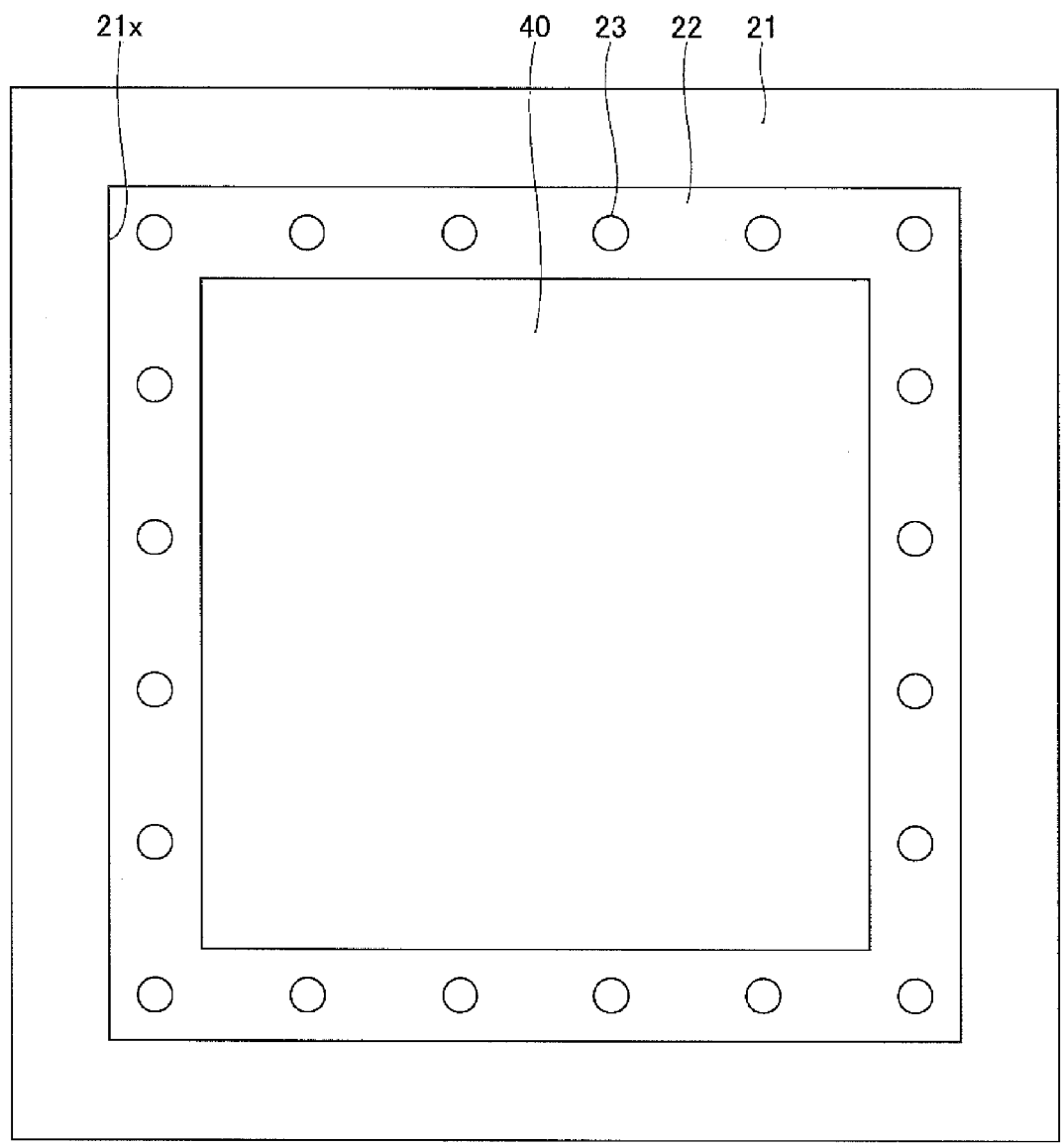
FIG. 2 is a plan view of the semiconductor device of the first embodiment.

FIG. 2 is a plan view of the semiconductor device 10 of the first embodiment. Referring to FIG. 2, the substrate body 21, the resin portion 22, the through wiring 23, and the semiconductor chip 40 are illustrated, and the other portions of the semiconductor device 10 are omitted.

Referring to FIG. 1 and FIG. 2, the substrate body 21 is shaped like a rectangular frame or an architrave having an opening portion 21x in a center of the substrate body 21, and the semiconductor chip 40 substantially shaped like a rectangle is accommodated inside the opening portion 21x. The substrate body 21 is a glass plate made of borosilicate glass, non-alkali glass, quartz glass, photosensitive glass or the like. In a case where the semiconductor chip 40 contains silicon, borosilicate glass or the like having a coefficient of thermal expansion (CTE) approximately the same as that of silicon may be used as the substrate body 21. Thus, deflection, warpage or the like of the semiconductor device 10 can be preferably reduced. The coefficient of thermal expansion (CTE) of the semiconductor chip 40 containing silicon is about 3.4 ppm/° C., and the coefficient of thermal expansion (CTE) of borosilicate glass is about 3.3 ppm/° C. The thickness of the substrate 21 is, for example, 0.1 to 1 mm.

The opening portion 21x penetrates the substrate body 21 from a first surface 21a to a second surface 21b. The plan view of the opening portion 21x is substantially like a rectangle of, for example, about 10 mm×10 mm. The opening portion 21x may be shaped like a taper. Said differently, in FIG. 1, an inner side surface of the opening portion 21x may not be perpendicular to the first surface 21a or the second surface 21b of the substrate body 21. Said differently, the inner side surface of the opening portion 21x may be in a linear shape, a curved shape or a shape containing linear and curved portions.

The resin portion 22 is used to fill a space portion formed between an inner side surface of the opening portion 21x and a side surface of the semiconductor chip 40. The material of the resin portion 22 is, for example, an insulative resin such as an epoxy resin. The resin portion 22 may contain a filler such as silica ($SiO_2$). By adjusting the amount of the filler contained in the resin portion 22, it may be possible to adjust a coefficient of thermal expansion of the resin portion 22. The width of the resin portion 22 is, for example, about 0.2 to several mm.

The through hole 22x penetrates the resin portion 22 from the second surface 21b of the substrate body 21 to the first surface 21a of the substrate body 21 and further penetrates through the first insulating layer 24 and the first wiring layer 25. The through wiring 23 is formed inside the through hole 22x. The through hole 22x is substantially shaped like a circle having a diameter of, for example, about 10 μm to 300 μm. The pitch of the through holes 22x neighboring inside the resin portion 22 is, for example, about 20 μm to 600 μm. The material of the through wiring 23 is, for example, copper (Cu) or the like.

The semiconductor chip 40 is formed by installing a semiconductor integrated circuit (not illustrated) in a semiconductor substrate (not illustrated) containing silicon (Si) or germanium (Ge). The semiconductor integrated circuit (not illustrated) is formed on a side of the first insulating layer 24 of the semiconductor chip 40. Electrode pads (not illustrated) of the semiconductor chip 40 are electrically connected to the first wiring layer 25.

The first side surface 21a of the substrate body 21, an end surface of the resin portion 22 on the side of the first insulating layer 24, and a surface of the semiconductor chip 40 on which a circuit is formed are arranged substantially on the same plane. Further, the second surface 21b of the substrate body 21, an end surface of the resin portion 22 on the side of the fourth insulating layer 34, an end surface of the through wiring 23 on the side of the fourth insulating layer 34, and a back surface of the semiconductor chip 40 are substantially on the same plane.

The first insulating layer 24 is formed to cover the first surface 21a of the substrate body 21, an end surface of the resin portion 22 arranged on the same plane as that of the first surface 21a, and a circuit forming surface of the semiconductor chip 40 arranged on the same plane as that of the first surface 21a. The material of the first insulating layer 24 may be an insulating resin such as an epoxy resin and a polyimide resin. The thickness of the first insulating layer 24 may be about 5 to 50 μm.

The first wiring layer 25 is formed on the first insulating layer 24. The first wiring layer 25 includes a via wiring which penetrates through the first insulating layer 24 and fills the inside of a first via hole 24x exposing an end surface of the through wiring 23, and a wiring pattern formed on the first insulating layer 24. The wiring pattern is formed to have a predetermined shape in it plan view.

The first wiring layer 25 is electrically connected to an electrode pad (not illustrated) of a semiconductor chip 40 exposed inside the first via hole 24x. The first wiring layer 25 is electrically connected to the through wiring 23 formed inside the through hole 22x. For example, the material of the first wiring layer 25 may be copper (Cu) or the like. For example, the thicknesses of the first wiring layer 25 may be about 1 to 30 μm.

The second insulating layer 26 is formed to cover the first wiring layer 25 on the first insulating layer 24. The material of the second insulating layer 26 is similar to that of the first insulating layer 24 such as an insulating resin. The thickness of the second insulating layer 26 may be about 5 to 50 μm.

The second wiring layer 27 is formed on the second insulating layer 26. The second wiring layer 27 includes a via wiring which penetrates through the second insulating layer 26 and fills the inside of a second via hole 26x exposing the upper surface of the first wiring layer 25, and a wiring pattern formed on the second insulating layer 26. The wiring pattern is formed to have a predetermined shape in it plan view.

The second wiring layer 27 is electrically connected to the first wiring layer 25 exposed toward the inside of the second via hole 26x. For example, the material of the second wiring layer 27 may be copper (Cu) or the like. For example, the thickness of the second wiring layer 27 may be about 1 to 30 µm.

The third insulating layer 28 is formed to cover the second wiring layer 27 on the second insulating layer 26. The third insulating layer 28 has an opening portion 28x, and a part of the second wiring layer 27 is exposed inside the opening portion 28x. The material of the third insulating layer 28 is similar to that of the first insulating layer 24 such as an insulating resin. The thickness of the third insulating layer 28 may be about 5 through 50 µm. The third insulating layer 28 functions as a solder resist layer.

The second wiring layer 27 exposed inside the opening portion 28x functions as an electrode pad to be electrically connected with a semiconductor chip (not illustrated) or a semiconductor device (not illustrated). Hereinafter, the second wiring layer 27 exposed inside the opening portion 28x may be referred to as a first electrode pad 27. The plan view of the first electrode pad 27 may be like a circle having a diameter of about 40 through 120 µm. The pitch of the first electrode pads 27 may be about 100 through 200 µm.

The outer connecting terminal 29 is formed on the first electrode pad 27. The outer connecting terminal 29 functions as a terminal for electrically connecting the first electrode pad 27 with a semiconductor chip (not illustrated) and a semiconductor device (not illustrated). The outer connecting terminal 29 is, for example, a solder ball. The material of the solder ball may be an alloy containing Pb, an alloy containing Sn and Cu, an alloy containing Sn and Ag, an alloy containing Sn, Ag, and Cu, or the like.

Although the outer connecting terminal 29 is formed in an embodiment, it is not always necessary to form an outer connecting terminal 29. The first electrode pad 27 itself may be an outer connecting terminal. Said differently, it is sufficient to make a part of the second wiring layer be exposed out of the third insulating layer so that the outer connecting terminal 29 is formed.

When necessary, a metallic layer is formed on the first electrode pad 27 and an outer connecting terminal 29 may be formed on the metallic layer. An example of the metallic layer is an Au layer, a Ni/Au layer which is a metallic layer formed by laminating a Ni layer and an Au layer in this order, a Ni/Pd/Au layer which is a metallic layer formed by laminating a Ni layer, a Pd layer, and an Au layer in this order or the like.

The fourth insulating layer 34 is formed to cover the second surface 21b of the substrate body 21, an end surface of the resin portion 22 arranged on the same plane as that of the second surface 21b, and the back surface of the semiconductor chip 40. The material of the fourth insulating layer 34 is similar to that of the first insulating layer 24 such as an insulating resin. The thickness of the fourth insulating layer 34 may be about 5 through 50 µm.

The third wiring layer 35 is formed below the fourth insulating layer 34. The third wiring layer 35 includes a via wiring which penetrates through the fourth insulating layer 34 and fills the inside of a third via hole 34x exposing another end surface of the through wiring 23, and a wiring pattern formed below the fourth insulating layer 34. The wiring pattern is formed to have a predetermined shape in its plan view.

The third wiring layer 35 is electrically connected to the through wiring 23 exposed inside the third via hole 34x. For example, the material of the third wiring layer 35 may be copper (Cu) or the like. For example, the thickness of the wiring pattern forming the third wiring layer 35 may be about 1 to 30 µm.

The fifth insulating layer 36 is formed to cover the third wiring layer 35 below the fourth insulating layer 34. The material of the fifth insulating layer 36 is similar to that of the first insulating layer 24 such as an insulating resin. The thickness of the fifth insulating layer 36 may be about 5 through 50 µm.

The fourth wiring layer 37 is formed below the fifth insulating layer 36. The fourth wiring layer 37 includes a via wiring which penetrates through the fifth insulating layer 36 and fills the inside of a fourth via hole 36x, from which the upper surface of the third wiring layer 35 is exposed, and a wiring pattern formed below the fifth insulating layer 36. The wiring pattern is formed to have a predetermined shape in its plan view.

The fourth wiring layer 37 is electrically connected to the third wiring layer 35 exposed toward the inside of the fourth via hole 36x. For example, the material of the fourth wiring layer 37 may be copper (Cu) or the like. For example, the thicknesses of the fourth wiring layer 37 may be about 1 to 30 µm.

The sixth insulating layer 38 is formed to cover the fourth wiring layer 37 below the fifth insulating layer 36. The sixth insulating layer 38 has an opening portion 38x, and a part of the fourth wiring layer 37 is exposed inside the opening portion 38x. The material of the sixth insulating layer 38 is similar to that of the first insulating layer 24 such as an insulating resin. For example, the thickness of the sixth insulating layer 38 may be about 5 through 50 µm. The sixth insulating layer 38 functions as a solder resist layer.

The fourth wiring layer 37 exposed inside the opening portion 38x functions as an electrode pad which is electrically connected to a mounting board (not illustrated) such as a motherboard. Hereinafter, the fourth wiring layer 37 exposed inside the opening portion 38x may be referred to as a second electrode pad 37. When necessary, a metallic layer may be formed below the second electrode pad 37. An example of the metallic layer is an Au layer, a Ni/Au layer which is a metallic layer formed by laminating a Ni layer and an Au layer in this order, a Ni/Pd/Au layer which is a metallic layer formed by laminating a Ni layer, a Pd layer, and an Au layer in this order or the like.

Further, an outer connecting terminal such as a solder ball and a lead pin may be formed below the second electrode pad 37 (a metallic layer when the metallic layer is formed below the second electrode pad 37). The outer connecting terminal is used to electrically connect with a mounting board (not illustrated) such as a motherboard. However, the second electrode pad 37 (a metallic layer when the metallic layer is formed below the second electrode pad 37) itself may be an outer connecting terminal.

The plan view of the second electrode pad 37 may be like a circle having a diameter of about 100 through 1000 µm. The diameter of the second electrode pad 37 electrically connected to the mounting board (not illustrated) such as a motherboard is greater than the diameter (e.g., about 40 to 120 µm) of the first electrode pad 27 electrically connected to the semiconductor chip (not illustrated) or the semiconductor device (not illustrated). The pitch of the second electrode pads 37 may be about 500 through 1200 µm. The pitch of the second electrode pads 37 electrically connected to the mounting board (not illustrated) such as a motherboard is greater than the pitch (e.g., about 100 to 200 μm) of the first electrode pads 27 electrically connected to the semiconductor chip (not illustrated) or the semiconductor device (not illustrated).

[A Manufacturing Method of a Semiconductor Device of the First Embodiment]

Next, the manufacturing method of the semiconductor device of the first embodiment is described. FIG. 3A to FIG. 16 illustrate manufacturing processes of the semiconductor device of the first embodiment. Referring to FIG. 3A to FIG. 16, lines C designate cut positions (hereinafter, referred to as cut positions C) at a time of separating the semiconductor device into pieces. FIG. 3A to FIG. 16 are turned over relative to FIG. 1.

Figure 3A:
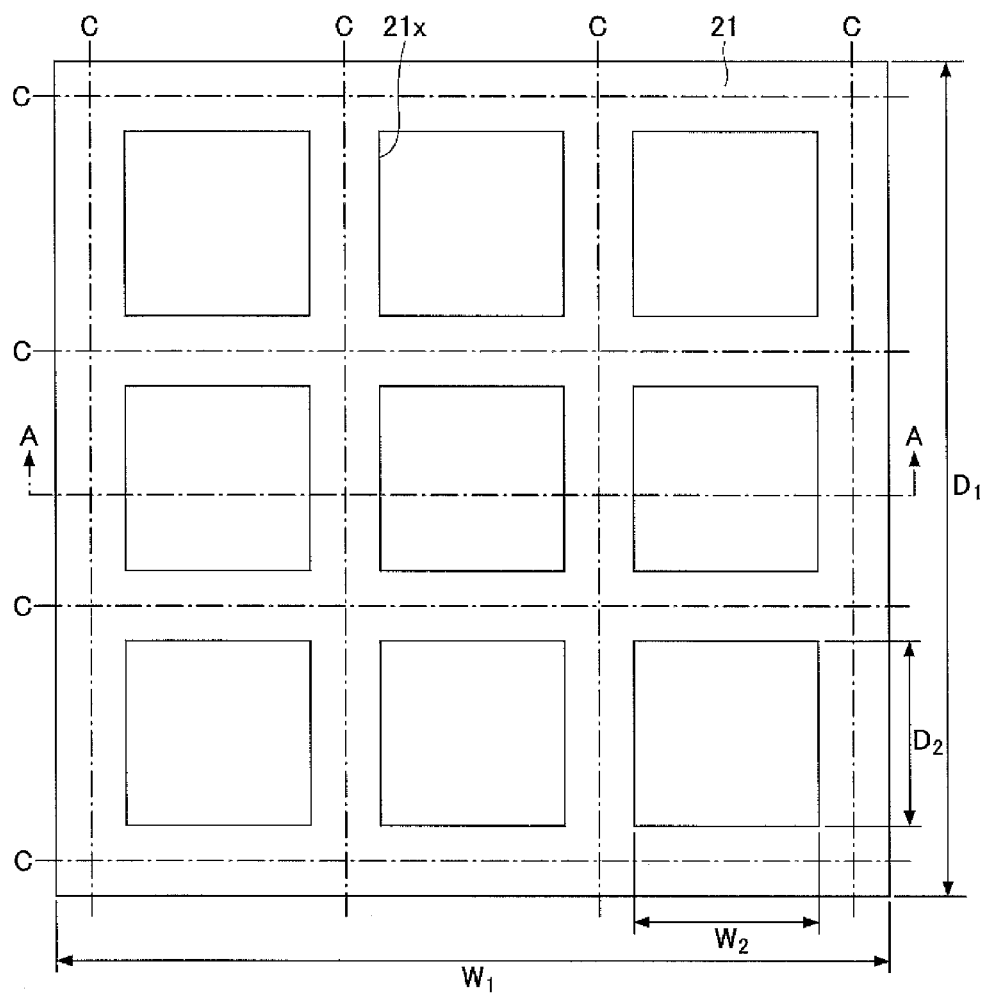
FIG. 3A and FIG. 3B illustrate a manufacturing process of the semiconductor device of the first embodiment.
Figure 3B:
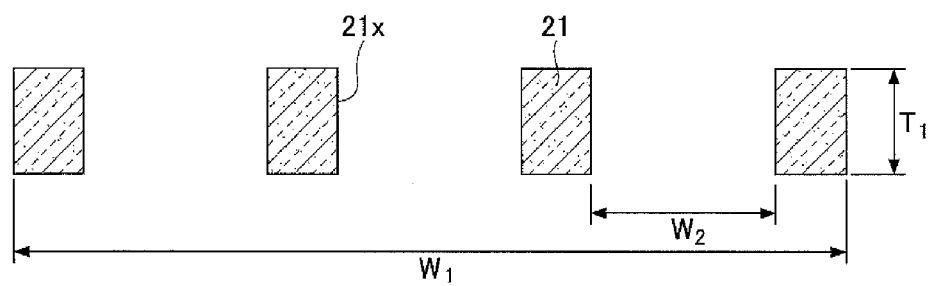

In the process illustrated in FIG. 3A and FIG. 3B, a glass plate made of borosilicate glass, non-alkali glass, quartz glass, photosensitive glass or the like is prepared, and plural opening portions 21x are formed in the prepared glass plate. Thus, the substrate body 21 is manufactured. FIG. 3A is a plan view and FIG. 3B is a cross-sectional view taken along a line A-A.

The width $W_1$ and the depth $D_1$ of the substrate body 21 are about 150 to 1000 mm, respectively. The thickness $T_1$ of the substrate 21 is, for example, 0.1 to 1 mm. The opening portion 21x can be formed by a method such as sandblasting or ultrasonic machining. When the photosensitive glass is used as the substrate body 21, the opening portion 21x can be formed by emitting ultraviolet rays into the substrate body 21.

The width $W_2$ and the depth $D_2$ of the substrate body 21 are about 10 mm, respectively. The semiconductor chip 40 is accommodated in the opening portion 21x in the process described later (see FIG. 5), and the resin portion 22 is formed in a part of the opening portion 21x. Therefore, the width $W_2$ and the depth $D_2$ of the opening portion 21x are appropriately determined in consideration of the width and the depth of the semiconductor chip 40 and the width of the resin portion 22. Further, the thickness $T_1$ of the substrate body 21 is appropriately determined so as to be substantially the same as the thickness of the semiconductor chip 40. Although it is difficult to form minute through holes having a diameter of about several tens μm in the glass plate, since the opening portion 21x is greater than the minute through holes, it is possible to form the opening portion 21x easier than the minute through holes.

Within the first embodiment, the plan view of the substrate body 21 is like a rectangle. However, the plan view of the substrate body 21 before being separated into the pieces may be a circle, an oval, an ellipse or the like. Referring to FIG. 3A and FIG. 3B, nine opening portions 21x are provided in the substrate body 21 for easiness. However, many opening portions 21x more than nine can be provided. The substrate body 21 is cut into pieces at cut positions C to be substrate bodies 21 of semiconductor devices 10.

Figure 4:
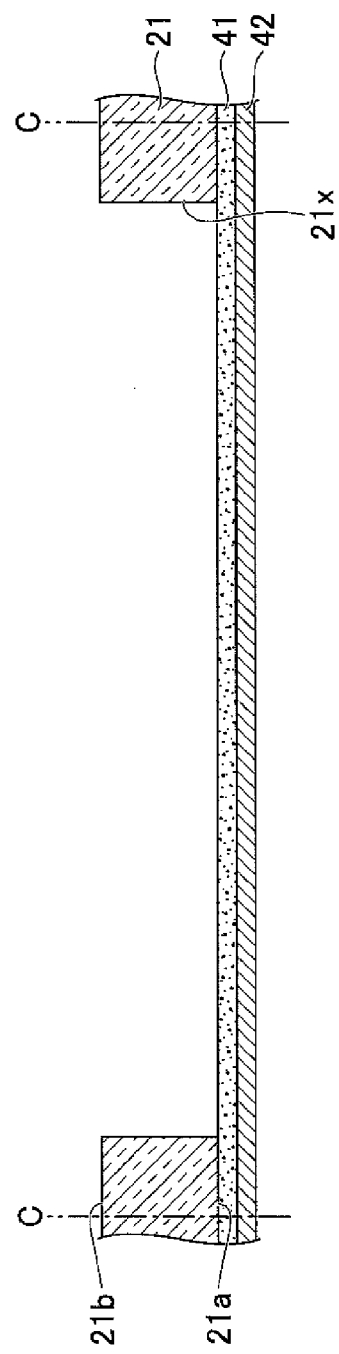
FIG. 4 illustrates the manufacturing process of the semiconductor device of the first embodiment.

Referring to FIG. 4, the supporting member 42 in a flat plate shape is prepared. The substrate body 21 is bonded to a first surface of the supporting member 42 via a two-sided adhesive agent 41. A part of the two-sided adhesive agent 41 is exposed inside the opening portion 21x of the substrate body 21. The supporting member 42 may be made of, for example, a copper sheet, a tape, a resin plate or the like. The thickness of the supporting member 42 is, for example, about several mm.

Figure 5:
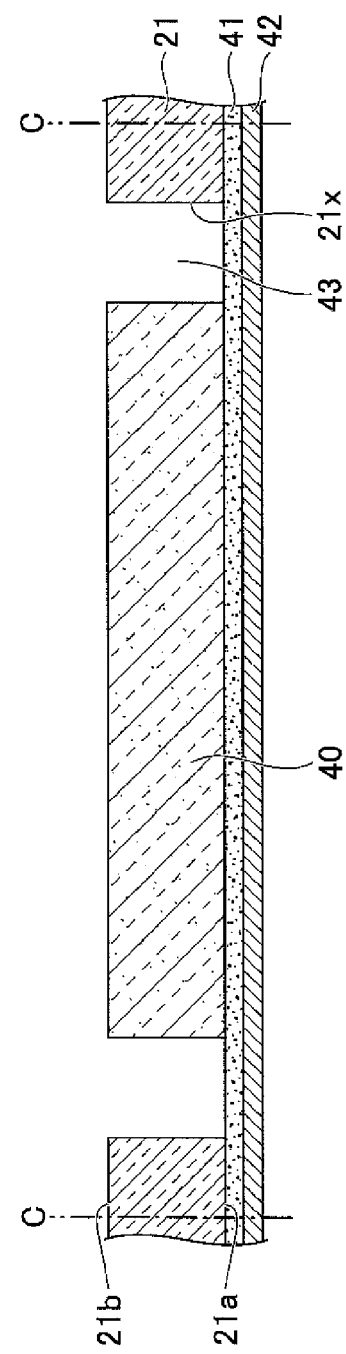
FIG. 5 illustrates the manufacturing process of the semiconductor device of the first embodiment.

Referring to the process of FIG. 5, plural semiconductor chips 40 are prepared. The circuit forming surfaces of the semiconductor chips 40 are directed to the side of the two-sided adhesive agent 41 so as to be faced down. Then, the semiconductor chips 40 are accommodated in the opening portions 21x of the substrate body 21. The semiconductor chips 40 are fixed to the opening portions 21x by the two-sided adhesive agent 41. Alignment marks for previously positioning the substrate body 21 relative to the semiconductor chip 40 are formed on the substrate body 21 and the semiconductor chip 40. By recognizing the alignment marks of the substrate body 21 and the semiconductor chip 40 using a predetermined positioning device and positioning the semiconductor chips 40 relative to the substrate body 21, the semiconductor chips 40 are accommodated in the opening portions 21x of the substrate body 21. A space portion 43 is formed between the inner side surfaces of the opening portions 21x and the semiconductor chips 40. The width of the space portion 43 is, for example, about 0.2 to several mm.

Figure 6:
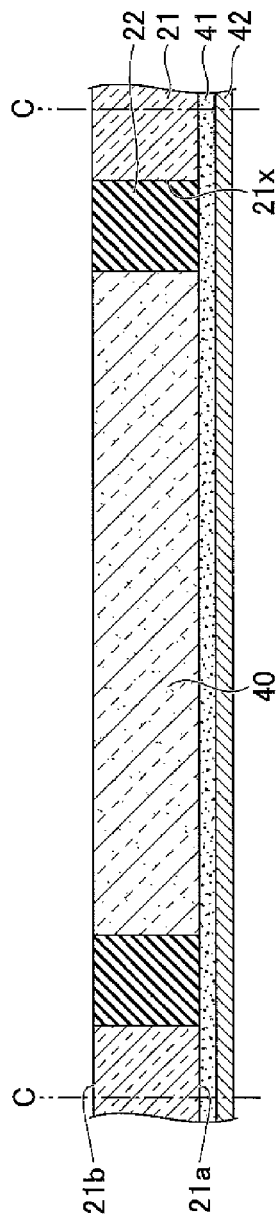
FIG. 6 illustrates the manufacturing process of the semiconductor device of the first embodiment.

Next, referring to FIG. 6, the resin portion 22 is formed to fill the space portion 43. The resin portion 22 may be formed by coating the space portion 43 with a material of the resin portion 22 using, for example, a dispenser. The resin portion 22 may be formed by filling the space portion 43 with a material of the resin portion 22 using, for example, a printing method. The material of the resin portion 22 may be a thermosetting epoxy resin or a thermosetting polyimide resin in a liquid form, a paste form or the like. It is preferable to use a material excellent in a space filling property. When the thermosetting epoxy resin or the thermosetting polyimide resin in the liquid form, the paste form or the like is used as the material of the resin portion 22, the resin portion 22 is heated to be a curing temperature or greater after filling the space portion 43 with the resin portion 22 to thereby harden the resin portion 22.

Figure 7:
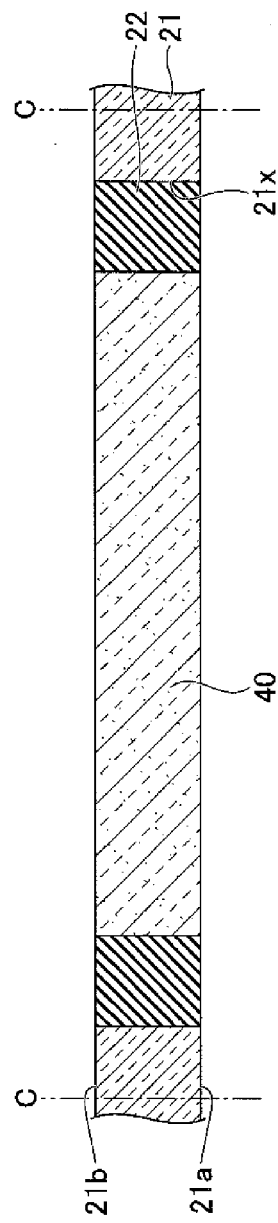
FIG. 7 illustrates the manufacturing process of the semiconductor device of the first embodiment.

Referring to FIG. 7, the two-sided adhesive agent 41 and the supporting member 42 are removed. The two-sided adhesive agent 41 and the supporting member 42 can be removed by mechanically peeling off. When the supporting member 42 is made of copper, the two-sided adhesive agent 41 and the supporting member 42 can be removed by wet etching using aqueous copper chloride, aqueous ammonium persulfate, or the like. The two-sided adhesive agent 41 may be removed by ashing.

In the processes illustrated in FIG. 6 and FIG. 7, it is preferable to flatten the substrate body 21 on the second surface 21b. For example, the second surface 21b may be mechanically ground to flatten the second surface 21b of the substrate body 21. By flattening the substrate body 21, it becomes possible to arrange the second surface 21b of the substrate body 21, the end surface of the resin portion 22 and the back surface of the semiconductor chip 40 so as to be on the same plane. The insulating layers and the wiring layers can easily be laminated in the following processes.

Figure 8:
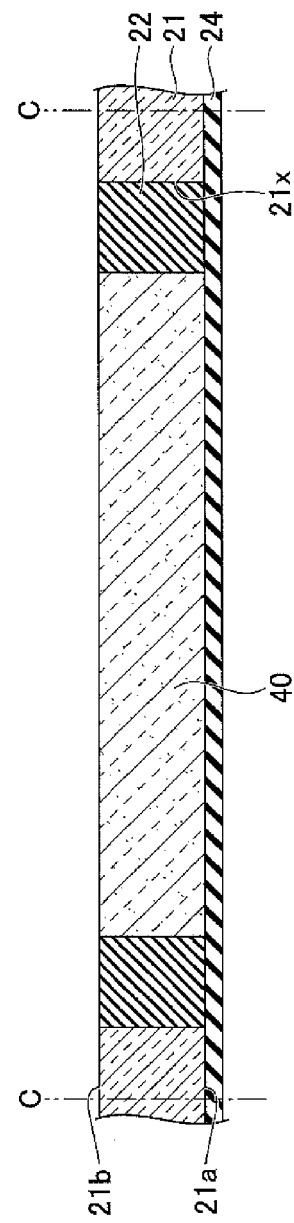
FIG. 8 illustrates the manufacturing process of the semiconductor device of the first embodiment.

Referring to the process illustrated in FIG. 8, the first insulating layer 24 is formed to cover the first surface 21a of the substrate body 21, an end surface of the resin portion 22 arranged on the same plane as the first surface 21a, and the circuit forming surface of the semiconductor chip 40 arranged on the same plane as the first surface 21a. The material of the first insulating resin layer 24 may be a thermosetting sheet-like insulating resin of an epoxy or polyimide resin or a thermosetting liquid-like or paste-like insulating resin of an epoxy or polyimide resin.

It is preferable to use a resin material in which a filler such as silica ($SiO_2$) is contained in order to facilitate formation of the first via hole 24x by laser processing or the like. By adjusting the amount of the filler contained in the first insulating layer 24, it is possible to adjust the coefficient of thermal expansion of the first insulating layer 24. The coefficients of thermal expansion of the other insulating layers may be adjusted in a manner similar thereto. The thickness of the first insulating layer 24 may be about 5 through 50 μm.

In a case where the sheet-like thermosetting resin such as an epoxy resin, polyimide resin or the like is used as the material of the first insulating layer 24, the sheet-like first insulating layer 24 is laminated so as to cover the first surface 21a of the substrate body 21, the end surface of the resin portion 22 on substantially the same plane as the first surface 21a, and the circuit forming surface on substantially the same plane as the first surface 21a. The coated first insulating layer 24 is heated at the curing temperature or greater to harden the laminated first insulating layer 24. It is possible to prevent voids from forming by laminating the first insulating layer 24 under a vacuum atmosphere.

In a case where the liquid-like or paste-like thermosetting resin such as an epoxy resin, a polyimide resin or the like is used as the material of the first insulating layer 24, the liquid-like or paste-like first insulating layer 24 is laminated so as to cover the first surface 21a of the substrate body 21, the end surface of the resin portion 22 on substantially the same plane as the first surface 21a, and the circuit forming surface on substantially the same plane as the first surface 21a by, for example, a spin coating method or the like. The coated first insulating layer 24 is heated at the curing temperature or greater to harden the coated first insulating layer 12.

Figure 9:
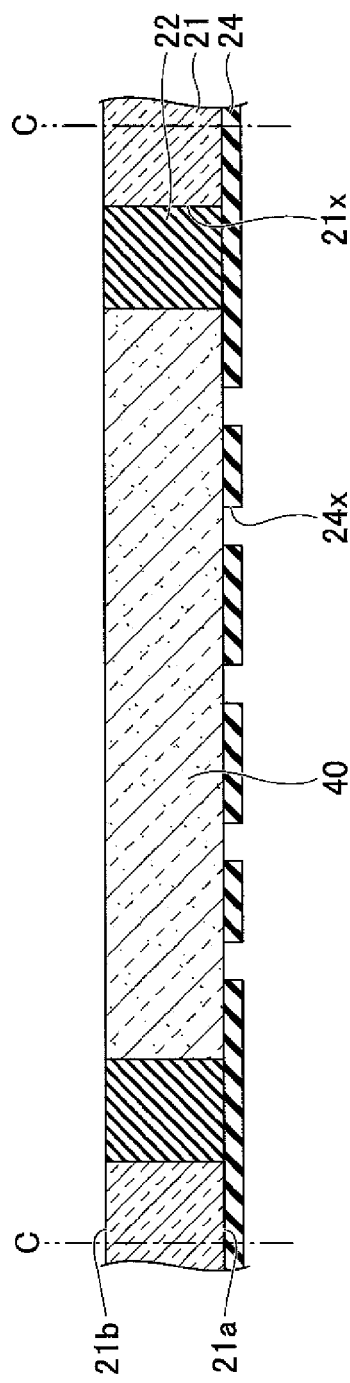
FIG. 9 illustrates the manufacturing process of the semiconductor device of the first embodiment.

Next, in the process illustrated in FIG. 9, a first via hole 24x penetrating the first insulating layer 24 is formed to expose the surface of the electrode pad (not illustrated) of the semiconductor chip 40 to the outside. The first via hole 24x may be formed by a laser processing method using, for example, $CO_2$ laser. The first via hole 24x formed by the laser processing method is opened to a side of the second insulating layer 26, and the bottom surface of the first via hole 24x is formed by a surface of an electrode pad (not illustrated) of the semiconductor chip. The area of the opening portion is greater than the area of the bottom surface to be a recess shaped like a truncated cone. The other via holes have similar shapes when the other via holes are processed by the laser processing method. When the first via hole 24x is processed by the laser processing method, a desmear process is preferably performed to remove a resin residue of the first insulating layer 24 attached to the surface of the electrode pad (not illustrated) of the semiconductor chip 40 exposed on the bottom surface of the first via hole 24x. When the other via holes are processed by the laser processing method, the desmear process is preferably performed to remove the resin residue.

The first via holes 24x may be formed by using a light-sensitive resin for the first insulating layer 24 and patterning the first insulating layer 24 with photolithography. Further, the first via holes 24x may be formed by printing a paste-like resin through a screen mask for masking a position corresponding to the first via hole 24x and curing the resin. The diameter of the first via hole 24x is, for example, about 50 μm.

Figure 10:
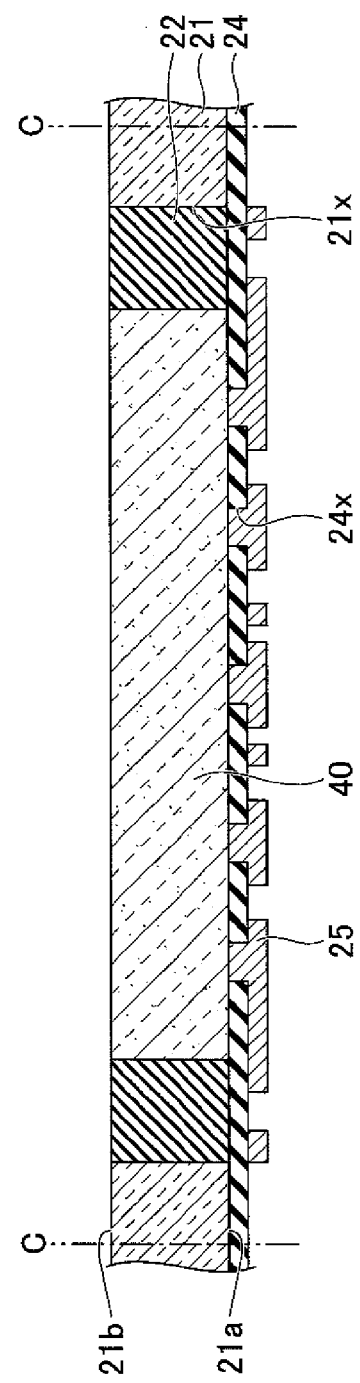
FIG. 10 illustrates the manufacturing process of the semiconductor device of the first embodiment.

Referring to FIG. 10, the first wiring layer 25 is formed below the first insulating layer 24. The first wiring layer 25 includes a via wiring formed inside the first via hole 24x and a wiring pattern formed below the first insulating layer 24. The first wiring layer 25 is electrically connected to an electrode pad (not illustrated) of the semiconductor chip 40 exposed inside the first via hole 24x. For example, the material of the first wiring layer 25 may be copper (Cu) or the like. The first wiring layer 25 may be formed by various wiring forming methods such as a semi-additive method and a subtractive method. If the wiring pattern is formed so as to open a position for forming the through hole 22x of the resin portion 22 and the first insulating layer 24, the through hole 22x is preferable formed using the wiring pattern as the mask in the following process.

Meanwhile, the resin portion 22 may be formed so that the end surface is recessed from the first surface 21a of the substrate body 21 by cure shrinkage. At this time, by forming the first insulating layer 24 on the first surface 21a of the substrate body 21 and the end surface of the resin portion 22 in the process illustrated in FIG. 8, it becomes possible to flatten the recess formed on the end surface of the resin portion 22 by filling the recess with the first insulating layer 24. Thus, it becomes possible to accurately form the first wiring layer 25 below the flat first insulating layer 24 in the process illustrated in FIG. 10. In the process illustrated in FIG. 11A and FIG. 11B described below, the through hole 22x can be accurately formed.

If the second surface 21b of the substrate body 21 is mechanically ground in the processes illustrated in FIG. 6 and FIG. 7, flatness between the second surface 21b of the substrate body 21 and the end surface of the resin portion 22 are ensured. In this case, the third wiring layer 35 may be directly formed on the second surface 21b of the substrate body 21 and the end surface of the resin portion 22 without forming a fourth insulating layer 34 in the process illustrated in FIG. 13.

In a second embodiment described later, if the semiconductor chip is not accommodated in the substrate body 21, the first surface 21a and the second surface 21b of the substrate body 21 may be mechanically ground to ensure the flatness.

Figure 11A:
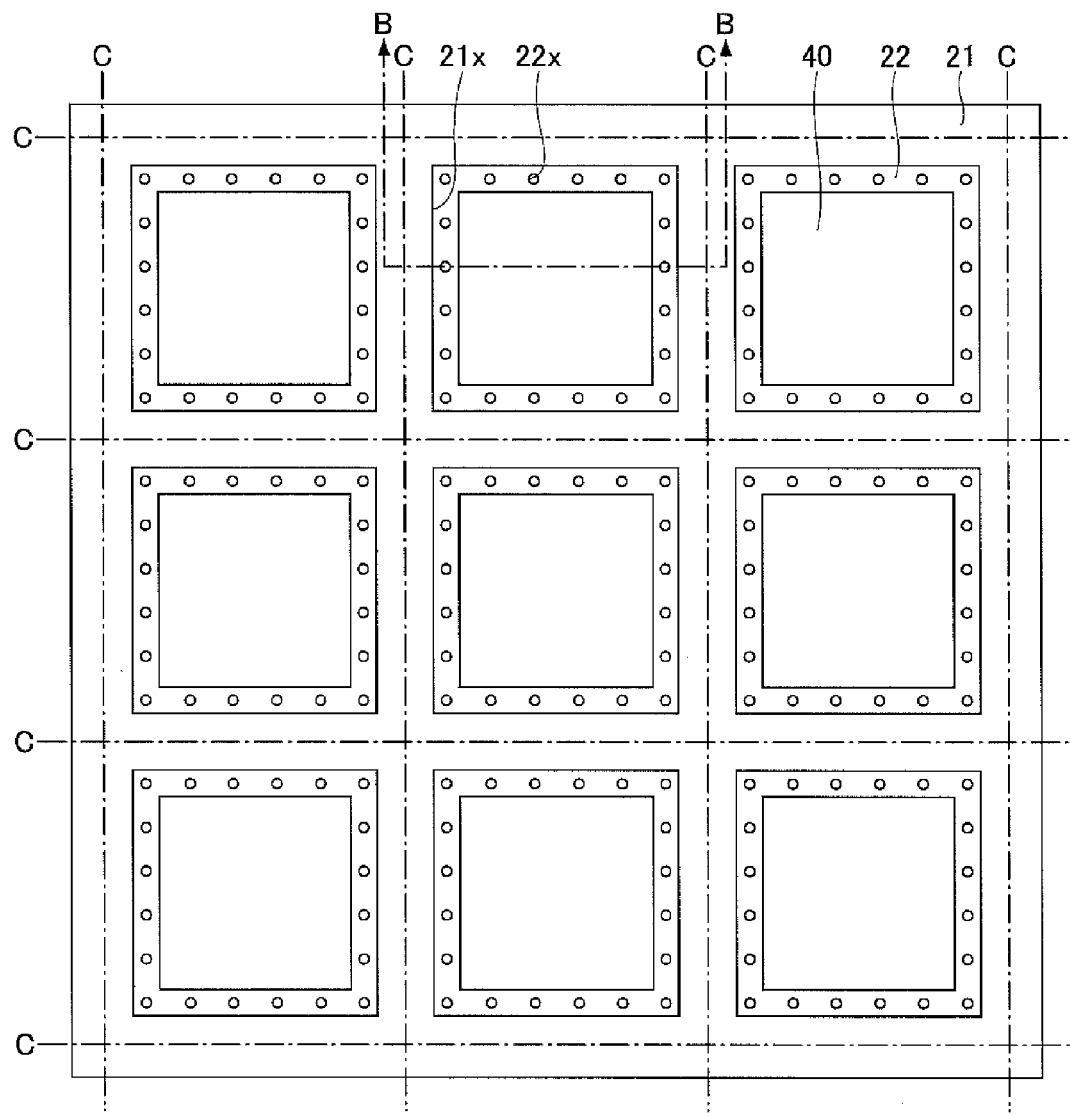
FIG. 11A and FIG. 11B illustrate the manufacturing process of the semiconductor device of the first embodiment.
Figure 11B:
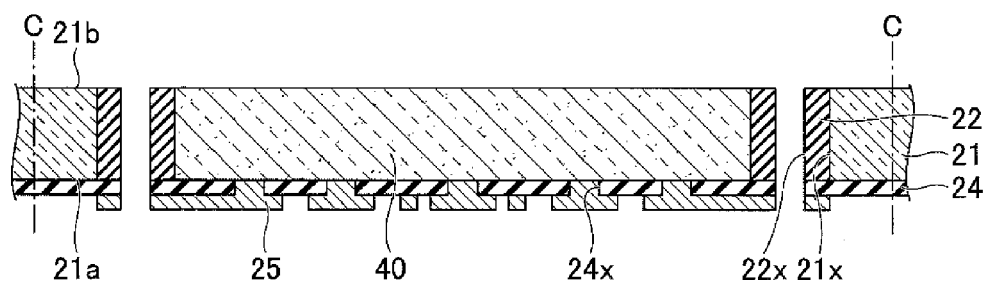

In the processes illustrated in FIG. 11A and FIG. 11B, the through hole 22x is formed in the resin portion 22 and the first insulating layer 24. FIG. 11A is a plan view and FIG. 11B is a cross-sectional view taken along a line B-B on FIG. 11A. The through hole 22x may be processed by, for example, a laser processing method using $CO_2$ laser and the wiring pattern included in the first wiring layer 25 as a mask. The opening portion of the wiring pattern may be a part of the through hole 22x. Meanwhile, a resist layer may be formed to open a position of forming the through hole below the first wiring layer 25, and a through hole 22x may be formed by, for example, a laser processing method using the resist layer as a mask.

The through hole 22x is substantially shaped like a circle having a diameter of, for example, about 10 μm to 300 μm. The pitch of the through holes 22x neighboring inside the resin portion 22 is, for example, about 20 μm to 600 μm. Unlike a case where a through hole is formed on the glass plate, a through hole 22x can be easily formed on the resin portion 22. When the through hole is formed on the through hole, it is possible to form about one hole per second, for example. When the through hole 22x is formed on the resin portion 22, it is possible to form about ten to one hundred holes per second, for example.

In the process illustrated in FIG. 12, the through wiring 23 is formed so as to fill the through hole 22x. The through wiring 23 may be formed by, for example, electroless plating. The through wiring 23 may be formed such that a seed layer is formed inside the through hole 22x and electro plating is performed using the seed layer. The material of the through wiring 23 is, for example, copper (Cu) or the like.

Next, in the process illustrated in FIG. 13, in a similar manner to the process illustrated in FIG. 8, the fourth insulating layer 34 is formed to cover the second surface 21b of the substrate body 21, the end surface of the resin portion 22 substantially on the same plane as the second surface 21b, the end surface of the through wiring 23, and the back surface of the semiconductor chip 40. In a manner similar to the process illustrated in FIG. 9, a third via hole 34x penetrating through the fourth insulating layer 34 and exposing the end surface of the through wiring 23 is formed. Further, in a manner similar to the process illustrated in FIG. 10, a third wiring layer 35 including a via wiring supplied inside the third via hole 34x and a wiring pattern is formed on the fourth insulating layer 34.

However, in the process illustrated in FIG. 13, the fourth insulating layer 34 may be formed to cover the second surface 21b of the substrate body 21, the end surface of the resin portion 22 substantially on the same plane as the second surface 21b, the end surface of the through wiring 23, and the back surface of the semiconductor chip 40.

Figure 14:
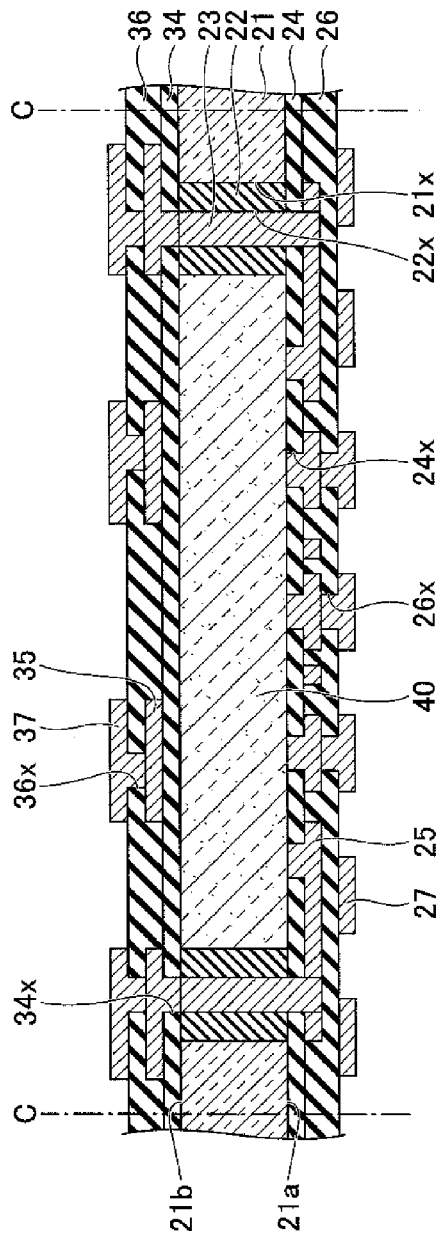
FIG. 14 illustrates the manufacturing process of the semiconductor device of the first embodiment.

Next, in the process illustrated in FIG. 14, in a manner similar to the processes illustrated in FIG. 8 to FIG. 10, a second insulating layer 26 covering the first wiring layer 25 is formed below the first insulating layer 24. Further, after forming the second via hole 26x penetrating through the second insulating layer 26, a second wiring layer 27 electrically connected to the first wiring layer 25 via the second via hole 26x is formed below the second insulating layer 26. After forming the fifth insulating layer 36 covering the third wiring layer 35 on the fourth insulating layer 34 and forming the fourth via hole 36x penetrating through the fifth insulating layer 36, the fourth wiring layer 37 electrically connected to the third wiring layer 35 via the fourth via hole 36x is formed on the fifth insulating layer 36.

Figure 15:
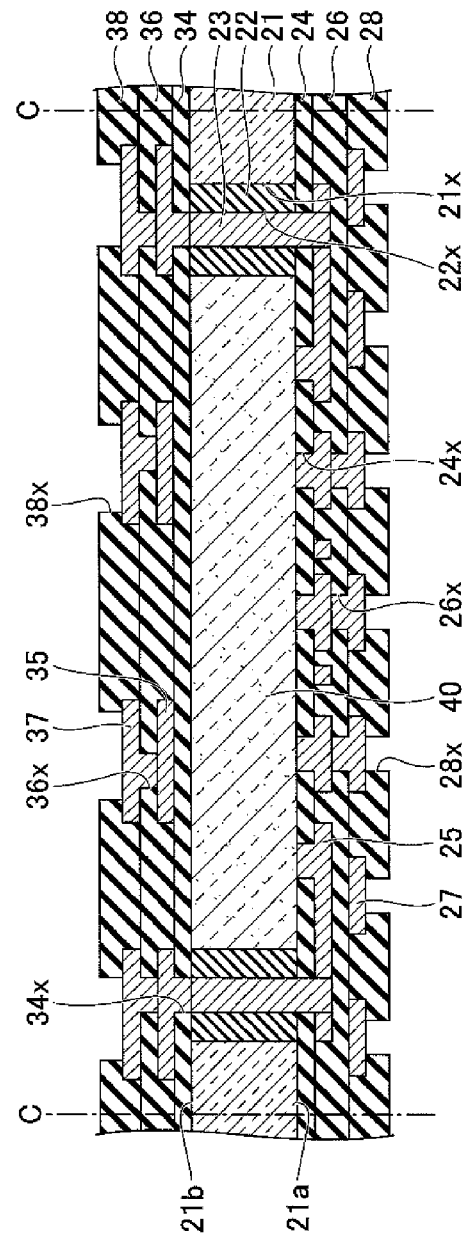
FIG. 15 illustrates the manufacturing process of the semiconductor device of the first embodiment.

Referring to FIG. 15, the third insulating layer 28 having the opening portion 28x is formed below the second insulating layer 26. The sixth insulating layer 38 having the opening portion 38x is formed on the fifth insulating layer 36. Specifically, a photosensitive resin containing an epoxy resin, an acrylic resin or the like is coated below the second insulating layer 26, and the coated photosensitive resin is exposed to light and developed to thereby form the opening portion 28x. A part of the second wiring layer 27 is exposed inside the opening portion 28x of the third insulating layer 28 as the first electrode pad 27. Further, a photosensitive resin containing an epoxy resin, an acrylic resin or the like is coated on the fifth insulating layer 36, and the coated photosensitive resin is exposed to light and developed to thereby form the opening portion 38x. A part of the fourth wiring layer 37 is exposed inside the opening portion 38x of the sixth insulating layer 38 as the second electrode pad 37. The third insulating layer 28 and the sixth insulating layer 38 function as solder resist layers.

Within the first embodiment, the two-layered wiring layers are formed below the first surface 21a and on the second surface 21b via the insulating layers. However, the number of the wiring layers formed below the first surface 21a and on the second surface 21b may be one or three or more.

Next, in the process illustrated in FIG. 16, the outer connecting terminal 29 is formed below the first electrode pad 27. The outer connecting terminal 29 is, for example, a solder ball. The material of the solder ball may be an alloy. containing Pb, an alloy containing Sn and Cu, an alloy containing Sn and Ag, an alloy containing Sn, Ag, and Cu, or the like.

The outer connecting terminal 29 can be formed by coating flux as a surface preparation agent on, for example, the first electrode pad 27. Thereafter, the solder ball is mounted on the outer connecting terminal and reflowed at a temperature of about 240° C. to 260° C. Thereafter, the surface is cleaned to remove flux. However, as described, the outer connecting terminal 29 may not be formed.

When necessary, a metallic layer may be formed on the second electrode pad 37. An example of the metallic layer is an Au layer, a Ni/Au layer which is a metallic layer formed by laminating a Ni layer and an Au layer in this order, a Ni/Pd/Au layer which is a metallic layer formed by laminating a Ni layer, a Pd layer, and an Au layer in this order or the like. The metallic layer may be formed by, for example, an electroless plating method.

Figure 16:
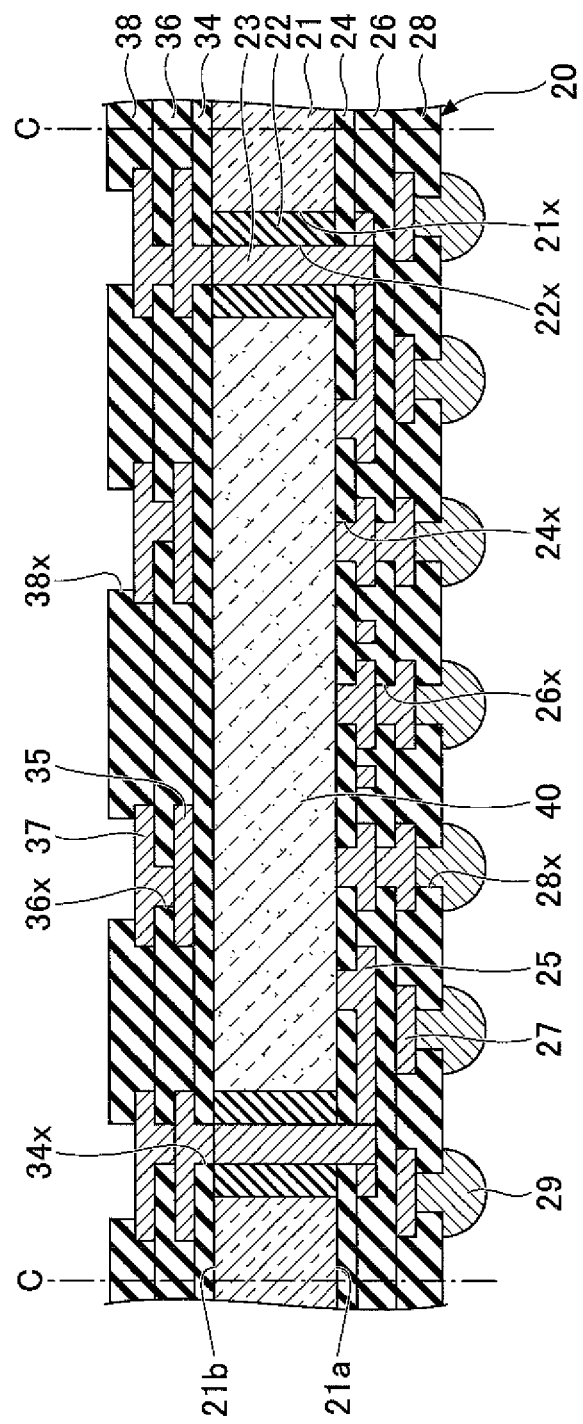
FIG. 16 illustrates the manufacturing process of the semiconductor device of the first embodiment.

Next, by cutting a structure illustrated in FIG. 16 into pieces at cut positions C, the semiconductor devices 10 illustrated in FIG. 1 are completed. The structure illustrated in FIG. 16 may be cut by dicing using a dicing blade. When the structure is cut into pieces, it is possible to cut so as to include plural semiconductor chips 40. In this case, the semiconductor device 10 having plural semiconductor chips 40 may be manufactured.

Within the first embodiment, the semiconductor device 10 accommodates the semiconductor chip 40 in the wiring substrate 20 which includes the substrate body 21. The semiconductor device 10 does not have a through hole in the substrate body 21 and has the through holes 22x in the resin portion 22 and the through wiring 23 inside the through holes 22x. In comparison with a case where the through holes are formed in the substrate body 21 which is the glass plate, it is possible to easily form minute through holes 22x in the resin portion 22. Therefore, it becomes possible to drastically facilitate the manufacturing process of the semiconductor device 10. The wiring layers formed on the both surfaces of the substrate body 21, which is the glass plate, can be electrically connected with ease.

By using the glass plate made of an insulating material, an insulating film may not be formed on a surface on the glass plate, unlike a case where a non-insulating material such as silicon and metal is used. Therefore, the manufacturing process of the semiconductor device 10 is simplified.

By using the glass plate as the substrate body 21, it becomes easy to select the shape of the substrate body 21 other than a circle in comparison with silicon, for which the shape other than a circle is difficult to select. Further, a degree of freedom in selecting a panel size can become drastically high.

Further, by using a transparent glass plate as the substrate body 21, it is possible to use an alignment mark provided on the first surface 21a of the substrate body 21 unlike a case where an opaque material such as silicon and metal is used At this time, the alignment mark can be seen through the transparent glass plate.

(Modified Example 1 of the First Embodiment)

Within the modified example 1 of the first embodiment, another shape of the opening portion on the substrate body 21, another position of the through wiring 23 formed on the substrate body 21 and the like are exemplified in comparison with the shape and the position in the first embodiment. In the modified example 1 of the first embodiment, explanation of constructional elements the same as those described in the above description of the first embodiment is omitted.

FIG. 17 to FIG. 21 are plan views of semiconductor devices of a modified example 1 of the first embodiment. Referring to FIG. 17 to FIG. 21, the semiconductor device is not cut into pieces yet. In FIG. 17 to FIG. 21, only a substrate body 21, a resin portion 22, a through wiring 23, and a semiconductor chip 40 are exemplified. Other constructional elements of the semiconductor device 10 are omitted.

Figure 17:
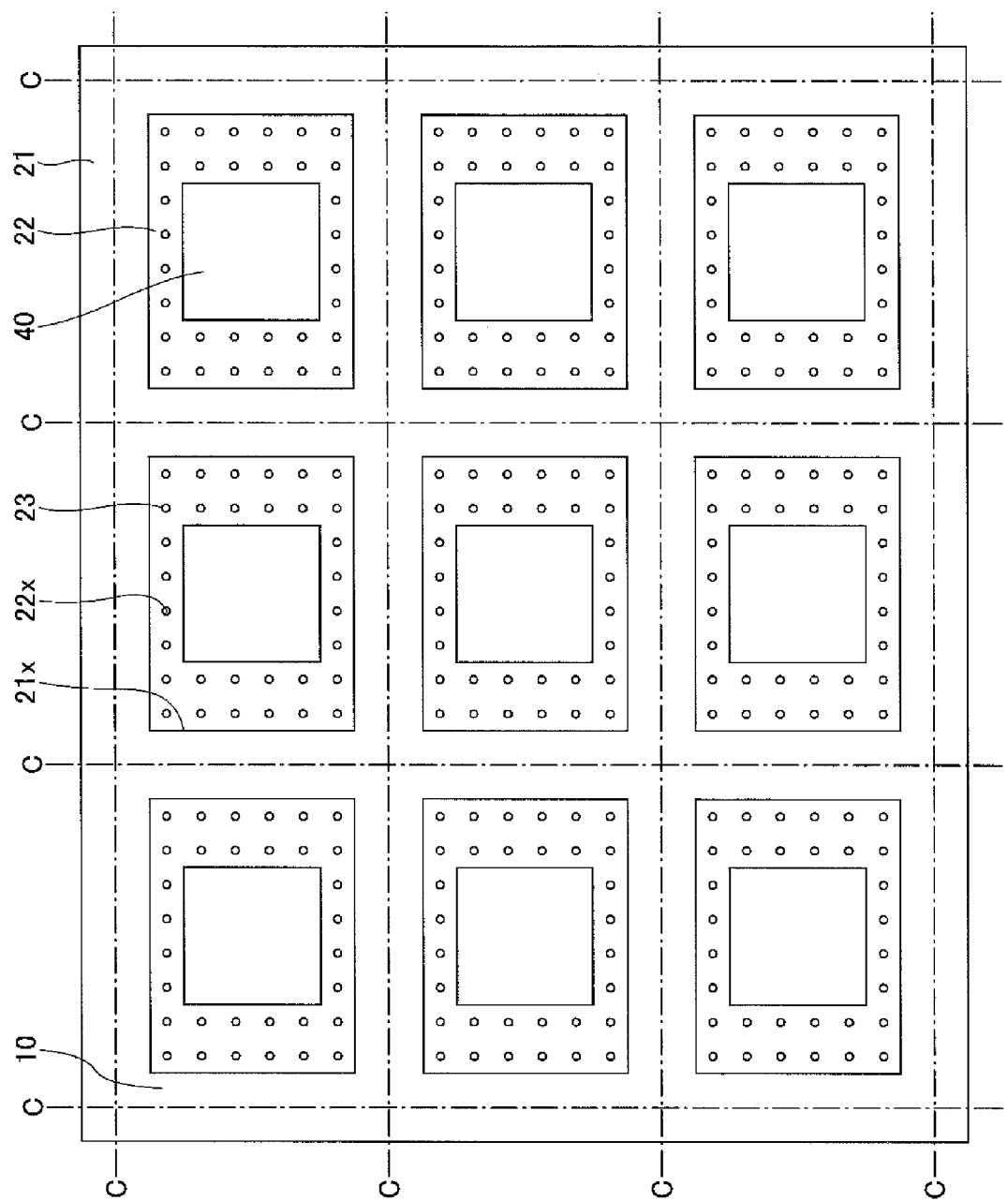
FIG. 17 is a plan view of a semiconductor device of a modified example 1 of the first embodiment.

Referring to FIG. 17, the through wirings 23 may be aligned in plural lines. Referring to FIG. 17, the plural lines of the through wirings 23 may be arranged in parallel with the X-axis, the Y-axis, or the Z-axis. Referring to FIG. 17, two lines of the through wirings 23 are arranged in parallel with the Y-axis. However, three lines or more of the through wirings 23 may be arranged in parallel with the X-axis or the Y-axis.

Figure 18:
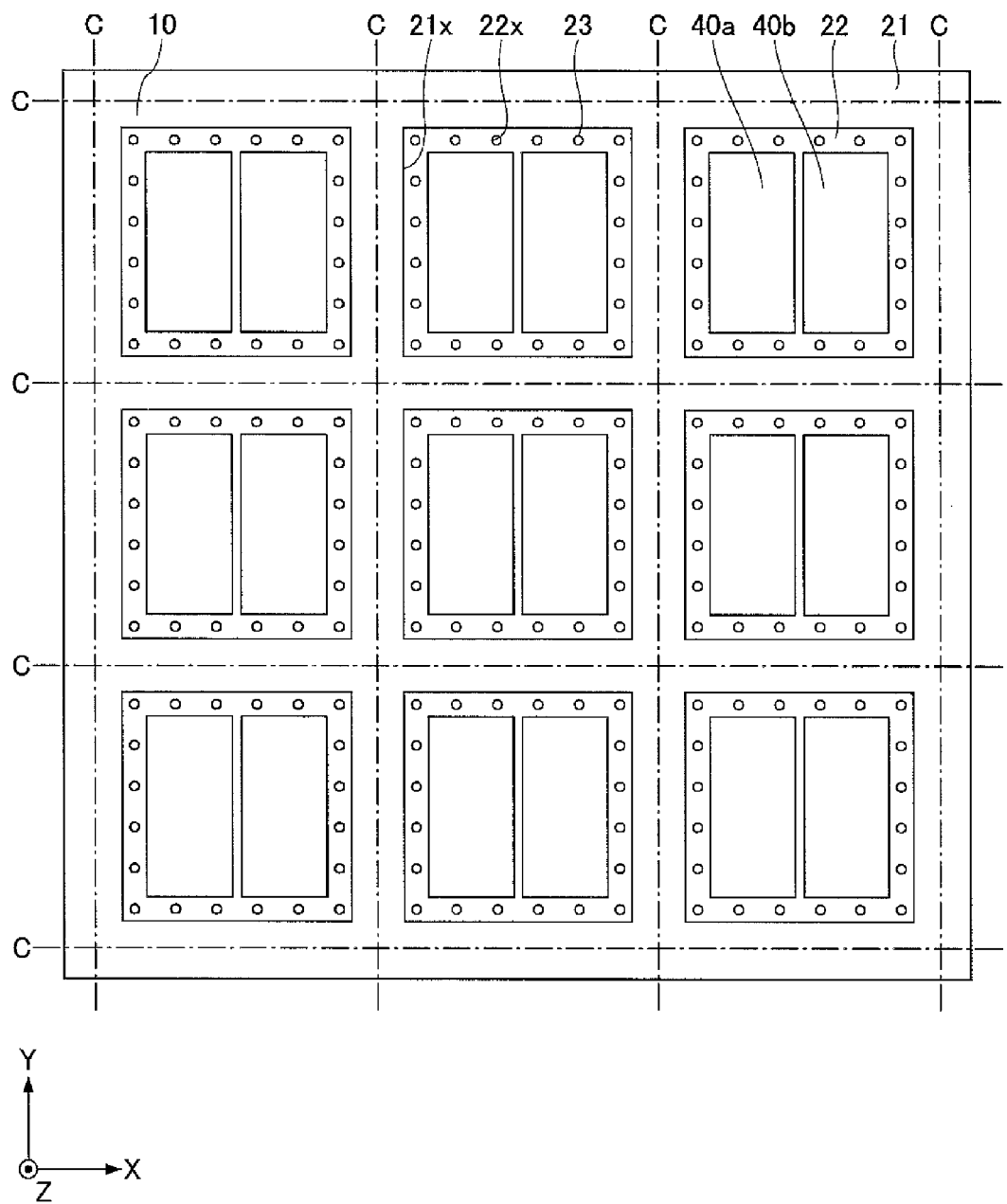
FIG. 18 is a plan view of another semiconductor device of the modified example 1 of the first embodiment.

Referring to FIG. 18, plural semiconductor chips may be accommodated inside the opening portions 21x. Referring to FIG. 18, two semiconductor chips 40a and 40b are accommodated in each of the semiconductor devices 10. However, the semiconductor chips of three or greater may be accommodated in each of the semiconductor devices 10. The plural semiconductor chips may have the same function or different functions. The shapes of the plural semiconductor chips may be the same or different. The through wirings 23 may be provided in the resin portion 22 filling in between the semiconductor chips in the semiconductor device 10.

Figure 19:
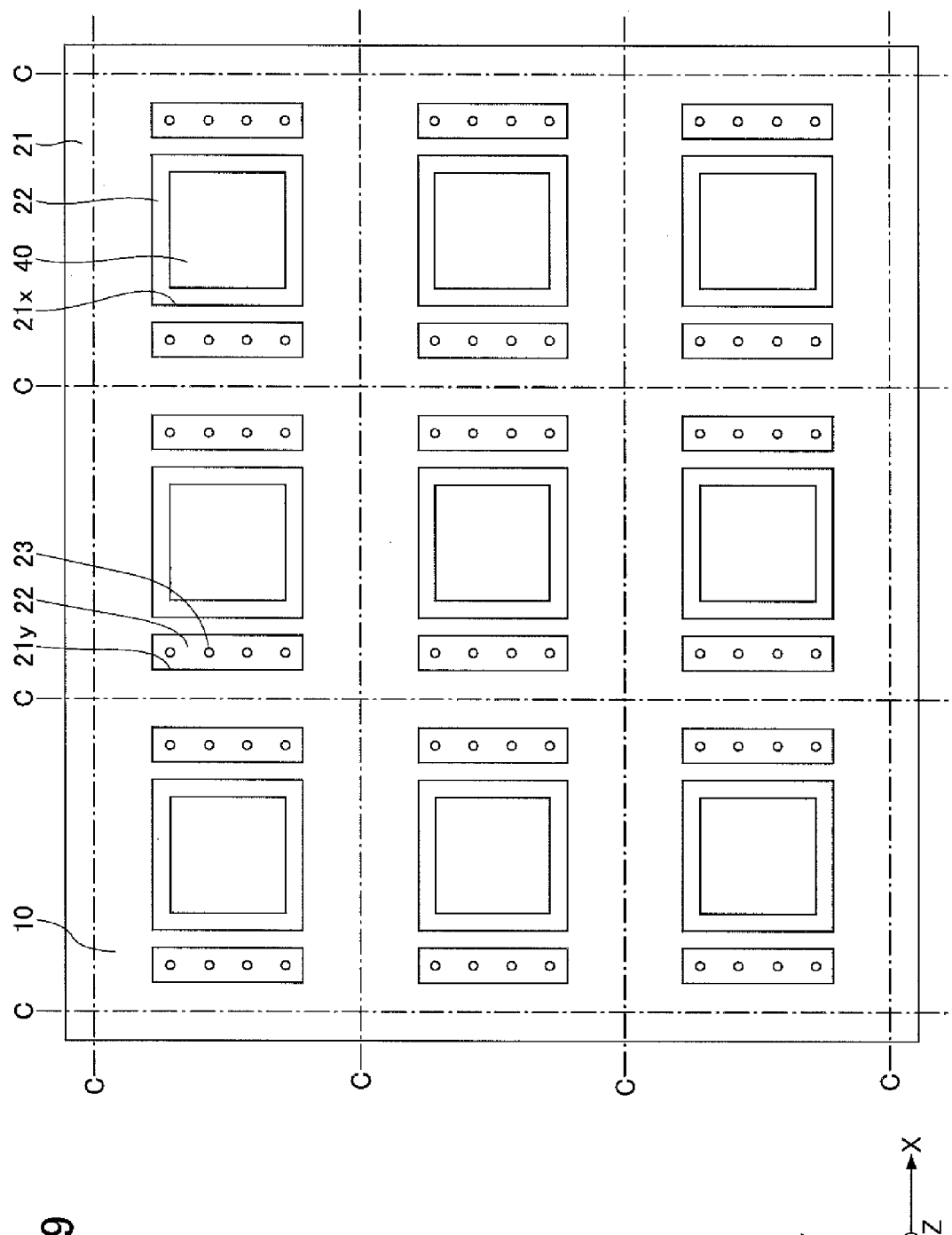
FIG. 19 is a plan view of another semiconductor device of the modified example 1 of the first embodiment.

Referring to FIG. 19, only the semiconductor chip 40 is accommodated in the opening portion 21x. An opening portion 21y for forming through wirings 23 may be provided in addition to the opening portion 21x. Referring to FIG. 19, the opening portions 21y penetrating a wiring substrate body 21 from a first surface 21a to a second surface 21b are formed on two sides of the opening portion 21x along the X direction. Then, the opening portions 21y are filled with a resin portion 22, and a through wiring 23 may be formed in the resin portion 22. The widths of the substrate body 21 positioned between the opening portion 21x and the opening portions 21y may be, for example, about 0.5 mm.

Figure 20:
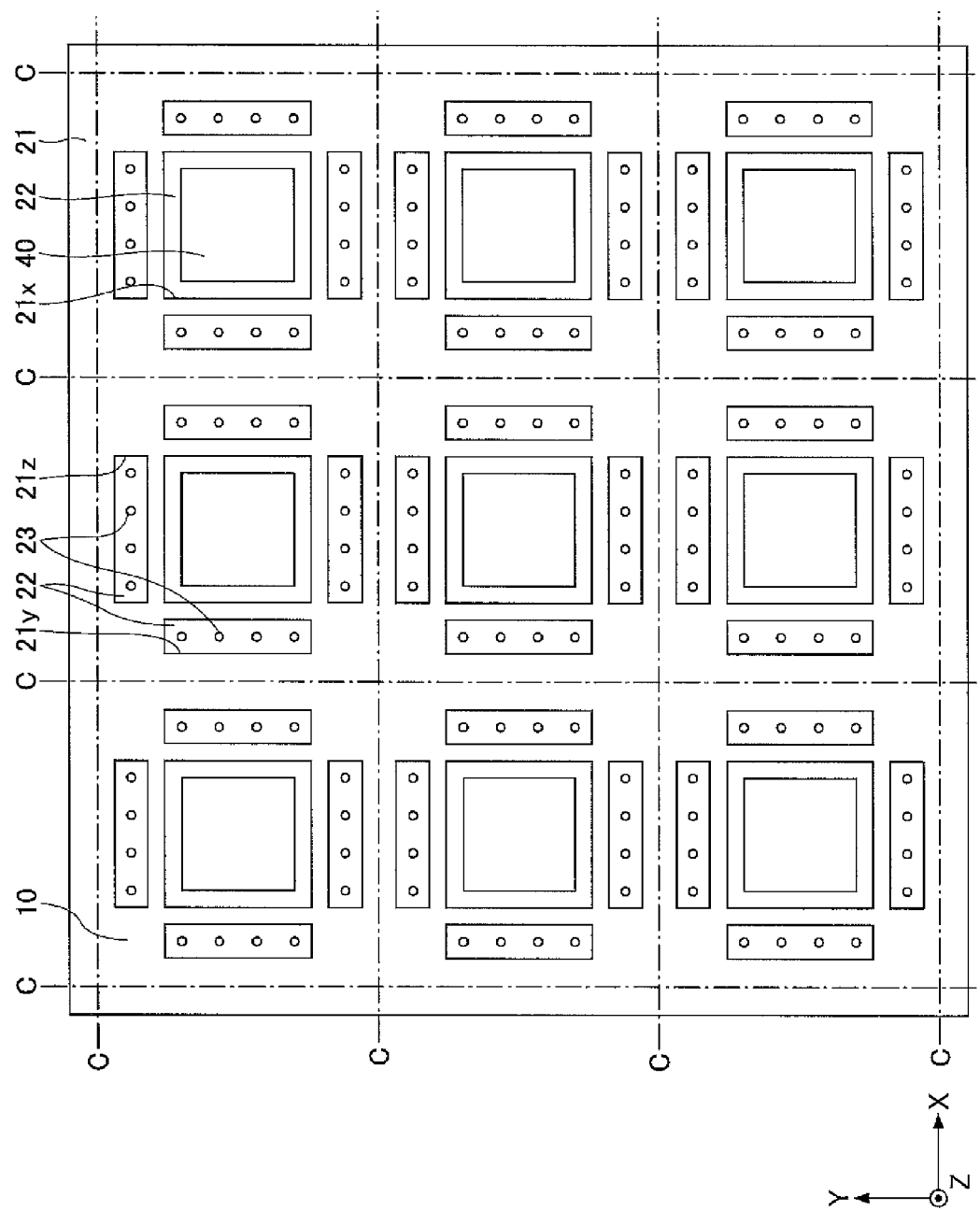
FIG. 20 is a plan view of another semiconductor device of the modified example 1 of the first embodiment.

Referring to FIG. 20, opening portions 21z penetrating a wiring substrate body 21 from a first surface 21a to a second surface 21b are formed on two sides of an opening portion 21x along the Y direction. Then, the opening portions 21z are filled with a resin portion 22, and a through wiring 23 may be formed in the resin portion 22.

Figure 21:
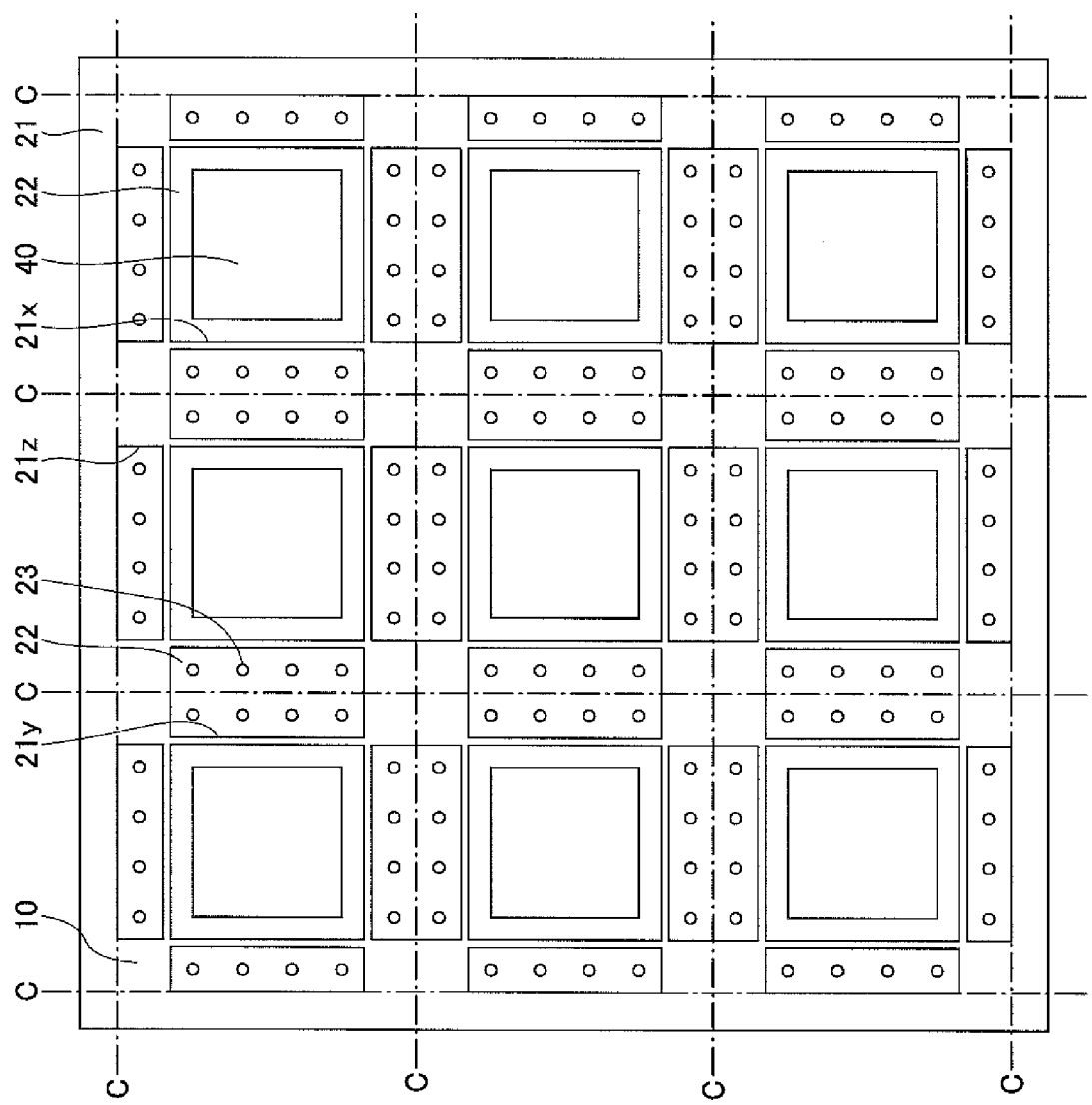
FIG. 21 is a plan view of another semiconductor device of the modified example 1 of the first embodiment.

Further, referring to FIG. 21, adjacent opening portions 21y or adjacent opening portions 21z of adjacent semiconductor devices may be integrated as a variation of the structure illustrated in FIG. 20. In this case, two lines of through wirings in resin portions 22 are divided at cut positions C. Said differently, if the structure illustrated in FIG. 21 is cut into pieces at the cut positions C, the opening portions 21y and 21z including two lines of the through wirings 23 are divided at the cut positions C. The divided single line of the through wirings 23 belongs to a corresponding semiconductor device 10. After the structure is cut into pieces to obtain the semiconductor devices 10, parts of the resin portion 22 filling the opening portions 21y and 21z are exposed from the substrate body 21 and the side surfaces of the semiconductor devices 10.

Referring to FIG. 21, because the resin portions 22 are partly cut instead of a glass plate by dicing, the glass plate is cut less than the case illustrated in FIG. 20. Because the resin portion 22 is softer than the glass plate, the dicing in FIG. 21 becomes easier than dicing in FIG. 20. Further, since the adjacent opening portions 21y and 21z are integrated and then cut into pieces, the semiconductor device can be further miniaturized.

As described herein, it is possible to appropriately select the shape of the opening portion in the substrate body 21, the position of the through wiring formed in the substrate body 21, the number of the semiconductor chips 40 accommodating the semiconductor chip 40, or the like. For example, the resin portion 22, in which the through wirings 23 are formed, may be formed (positioned) inside the opening portion 21x. The opening portion 21y and the opening portion 21z are formed in addition to the opening portion 21x, and the resin portion 22 may be formed (positioned) inside the opening portion 21y or the opening portion 21z.

(Modified Example 2 of the First Embodiment)

Within the modified example 2 of the first embodiment, a through wiring 53 has a coaxial structure. In the modified example 2 of the first embodiment, explanation of constructional elements the same as those described in the above description of the first embodiment is omitted.

Figure 22A:
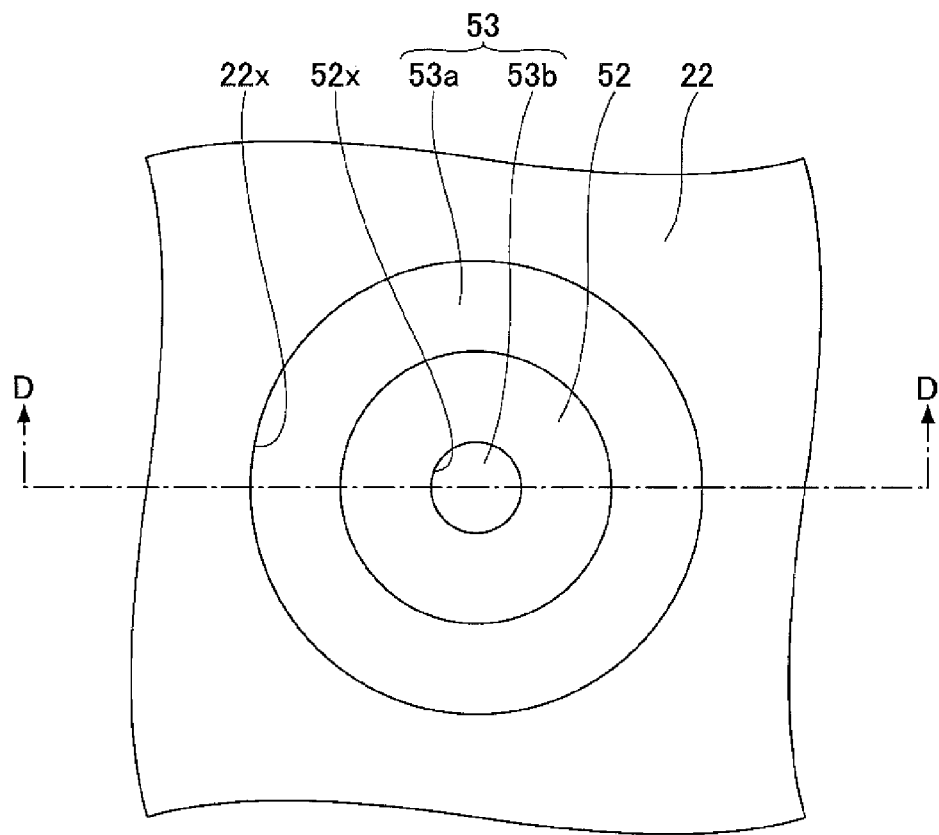
FIG. 22A and FIG. 22B illustrate a peripheral portion of a through wiring of a modified example 2 of the first embodiment.
Figure 22B:
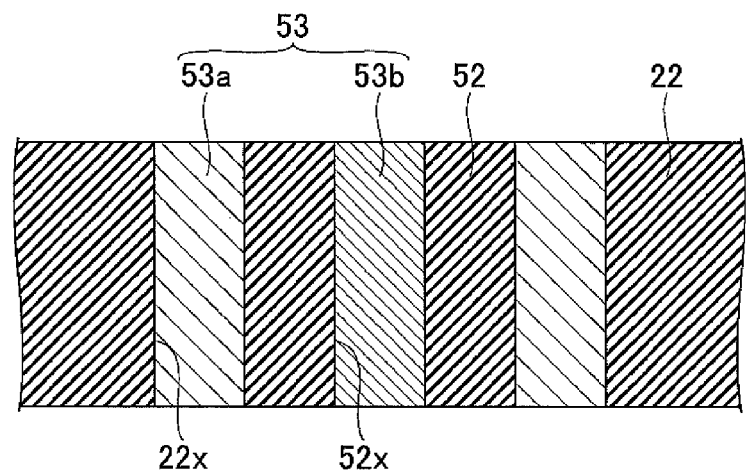

FIG. 22A and FIG. 22B illustrate a peripheral portion of the through wiring 53 of the modified example 2 of the first embodiment. FIG. 22A is a plan view, and FIG. 22B is a cross-sectional view taken along a line D-D. Referring to FIG. 22A and FIG. 22B, a through hole 22x is formed in a resin portion 22, and the through wiring 53 is formed inside the through hole 22x.

The through wiring 53 includes a shield portion 53a and a signal transmitting portion 53b. The plan view of the shield portion 53a is substantially like a circular ring or a hollow cone so as to cover the inner side surface of the through hole 22x. The shield portion 53a is electrically connected to a reference potential (GND) of a semiconductor device 10. The inside of the shield portion 53a (the circular ring) is filled with a resin portion 52 made of an insulating material. A through hole 52x is formed in the resin portion 52. A signal transmitting portion 53b is formed inside the through hole 52x.

The material of the resin portion 52 may be similar to, for example, that of the resin portion 22. The material of the through wiring 53 may be similar to, for example, that of the through wiring 23. The through wiring 53 may be formed instead of the through wiring 23 illustrated in FIG. 2, FIG. 17 to FIG. 21, or the like. The through wiring 23 and the through wiring 53 may simultaneously exist in the semiconductor device 10.

With the modified example 2 of the First Embodiment, effects similar to those in the First Embodiment are obtainable. Further, the following effects are obtainable. Said differently, the signal transmitting portion 53b is surrounded by the shielding portion 53a via the resin portion 52 made of the insulating material. The through wiring 53 has the coaxial structure in which the shield portion 53a is electrically connected with the reference potential of the semiconductor device 10. Therefore, exogenous noise can be prevented from affecting a signal flowing through the signal transmitting portion 53b. Further, it is possible to reduce electric coupling (capacitive coupling) generated between adjacent through wirings 53 thereby preventing the through wirings 53 from mutually becoming a noise source.

[b] Second Embodiment

With the Second Embodiment, a semiconductor device has a wiring substrate on which a semiconductor chip is mounted. In the Second Embodiment, explanation of constructional elements the same as those described in the above description of the First Embodiment is omitted.

Figure 23:
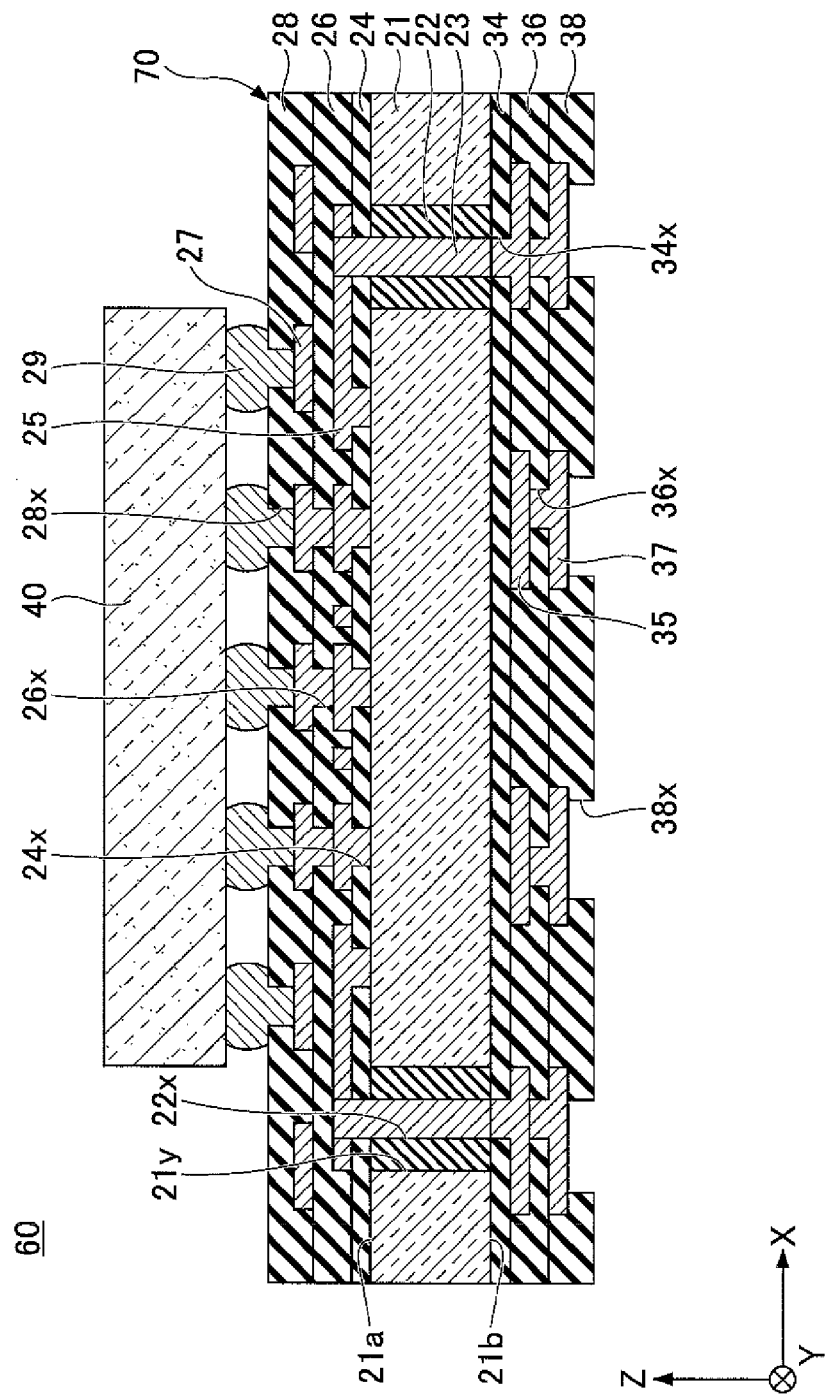
FIG. 23 is a cross-sectional view of a semiconductor device of a second embodiment.

FIG. 23 is a cross-sectional view of the semiconductor device of the second embodiment. Referring to FIG. 23, the semiconductor device 60 includes a wiring substrate 70 and a semiconductor chip 40 mounted on the wiring substrate 70. The layer structure of the wiring substrate 70 is similar to the layer structure of the wiring substrate 20. However, the opening portion 21x is not formed in a substrate body 21. Differences from the first embodiment are described in detail.

Figure 24:
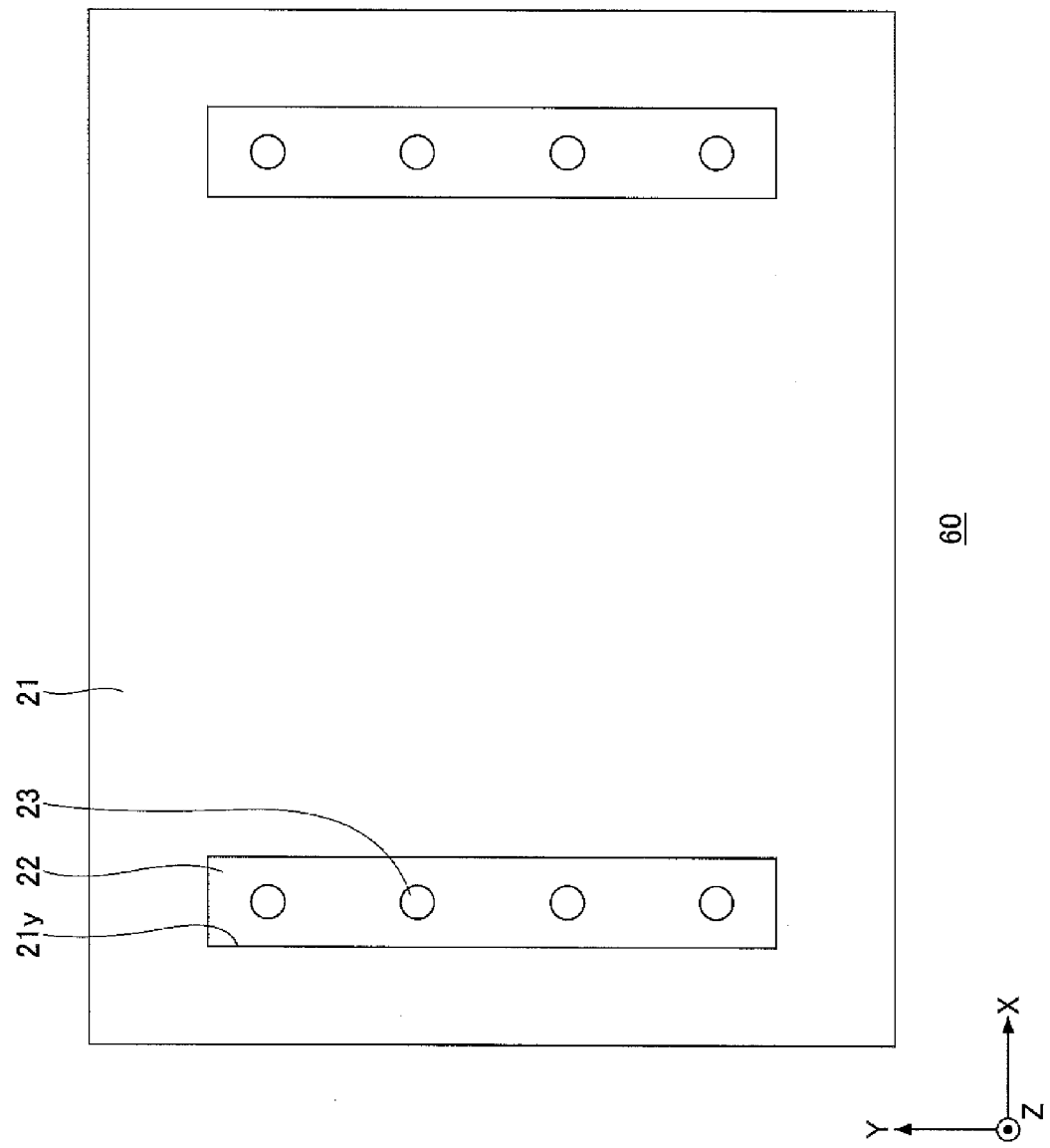
FIG. 24 is a plan view of the semiconductor device of the second embodiment.

FIG. 24 is a plan view of the semiconductor device of the second embodiment. In FIG. 24, only a substrate body 21, a resin portion 22, and a through wiring 23 are exemplified. Other constructional elements of the semiconductor device 60 are omitted. Referring to FIG. 23 and FIG. 24, the substrate body 21 is substantially shaped like a rectangle. Only opening portions 21y for forming through wirings 23 are formed and the opening portion 21x illustrated in FIG. 2 or the like is not formed. Two lines of the opening portions 21y are arranged in parallel with the Y axis interposing a predetermined gap between the lines. The insides of the opening portions are filled with the resin portions 22. The through wirings 23 are formed in the resin portions 22. Plural lines of the through wirings 23 may be formed inside the opening portions 21y. The opening portion for forming the through wirings 23 may be formed at the positions illustrated in FIG. 20 and FIG. 21.

First electrode pads 27 of the wiring substrate 70 and electrode pads (not illustrated) of the semiconductor chip 40 may be electrically connected via outer connecting terminals 29. A gap between the wiring substrate 70 and the semiconductor chip 40 may be filled with an underfill resin.

In manufacturing the semiconductor device 60, the wiring substrate 70 is formed in processes similar to those for the wiring substrate 20. However, the opening portions 21y are formed and the opening portion 21x is not formed. Then, the semiconductor chip 40 is prepared. The prepared semiconductor chip 40 is mounted on the wiring substrate 70 so that electrode pads (not illustrated) of the semiconductor chip 40 contact the outer connecting terminals 29 of the wiring substrate 70. The wiring substrate 70 on which the semiconductor chip 40 is mounted is carried into a reflow furnace. Solder or the like as the material of the outer connecting terminals 29 is melted in the reflow furnace and thereafter hardened. Thus, the first electrode pads 27 of the wiring substrate 70 and electrode pads (not illustrated) of the semiconductor chip 40 are electrically connected via the outer connecting terminals 29 to thereby complete the semiconductor device 60.

As described, the semiconductor chip may not be accommodated in the wiring substrate including the substrate body which is the glass plate and may be mounted on the wiring substrate including the substrate body which is the glass plate.

[c] Third Embodiment

With the Third Embodiment, the cases illustrated in FIG. 17 and FIG. 18 can be combined with the cases illustrated in FIG. 19 to FIG. 21. In the Third embodiment, explanation of constructional elements the same as those described in the above description of the First and Second Embodiments is omitted.

Figures 25, 26:
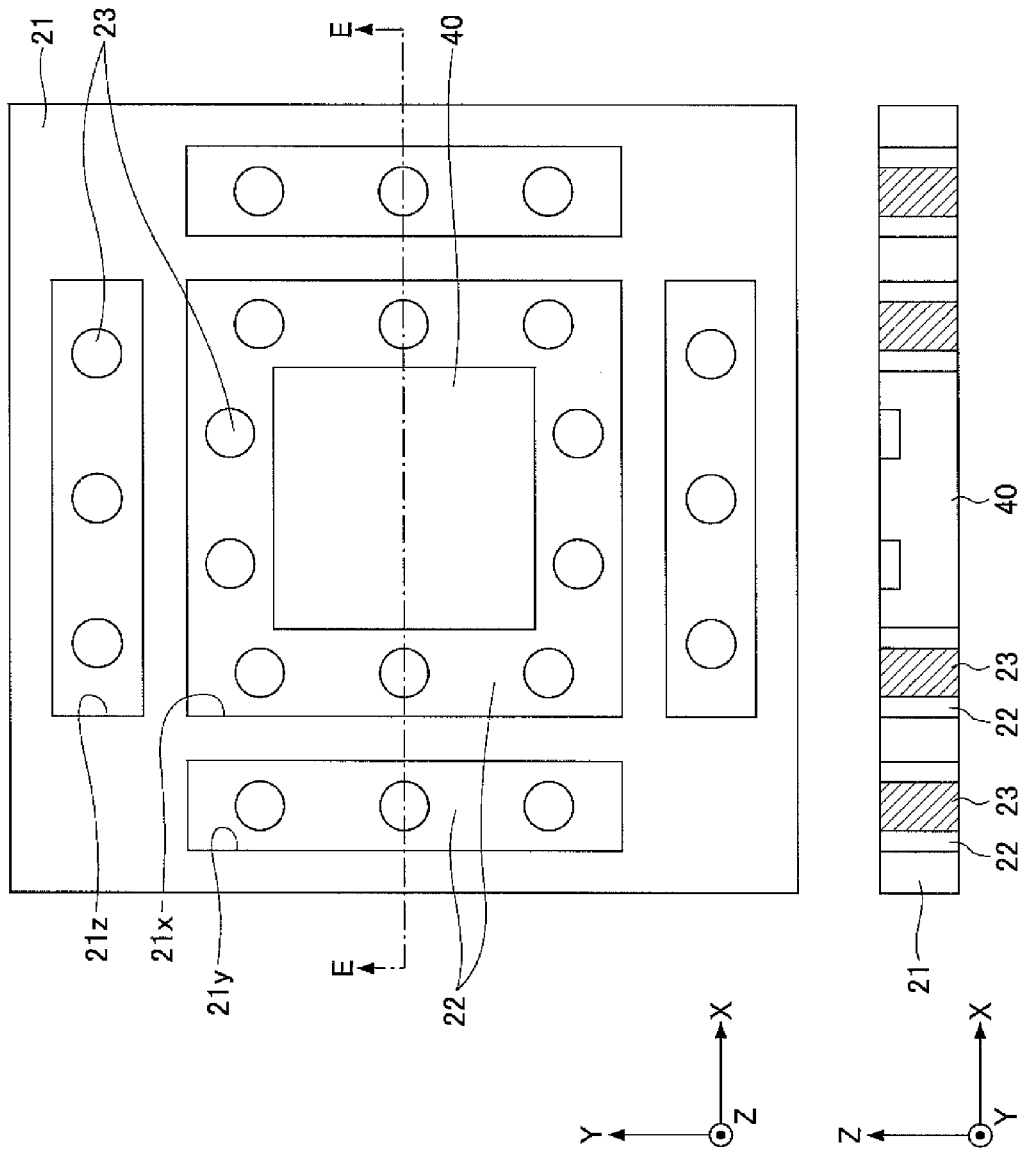
FIG. 25 is a plan view of a semiconductor device of the third embodiment.
FIG. 26 is a cross-sectional view of the semiconductor device illustrated in FIG. 25.

This variation is illustrated in, for example, FIG. 25 and FIG. 26. FIG. 25 is a plan view of the semiconductor device. FIG. 26 is a cross-sectional view of the semiconductor device illustrated in FIG. 25 taken along a line E-E.

Referring to FIG. 25, opening portions 21x, 21y, and 21z are simultaneously formed in one substrate body. In the opening portion 21x, a semiconductor chip 40 and a resin portion 22 having through electrodes 23 are accommodated. In the opening portions 21y and 21z, other resin portions 22 having through electrodes 23 are accommodated without accommodating a semiconductor chip.

Said differently, two different types of the opening portions exist in one substrate body 21.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A semiconductor device comprising:
a wiring substrate; and
a semiconductor chip having a first face and a second face opposite to the first face,
wherein the wiring substrate includes
a glass plate whose thickness is equal to a thickness of the semiconductor chip, the glass plate having a first surface and a second surface opposite to the first surface, the glass plate having an opening portion penetrating through the glass plate between the first surface of the glass plate and the second surface of the glass plate,
a resin portion having a first end face and a second end face opposite to the first end face, the resin portion penetrating through the glass plate between the first surface of the glass plate and the second surface of the glass plate, and
a through wiring penetrating through the resin portion between the first surface of the glass plate and the second surface of the glass plate to electrically connect a first wiring layer formed on a side of the first surface of the glass plate with a second wiring layer formed on a side of the second surface of the glass plate,
wherein the first surface of the glass plate, the first face of the semiconductor chip, and the first end face of the resin portion are aligned on a common plane, and
the second surface of the glass plate, the second face of the semiconductor chip, and the second end face of the resin portion are aligned on another common plane,
wherein the semiconductor chip is accommodated inside the opening portion,
a space portion formed between an inner side surface of the opening portion and a side surface of the semiconductor chip is filled with the resin portion, and
the resin portion is positioned inside the opening portion.
2. The semiconductor device according to claim 1,
wherein the inner side surface of the opening portion is tapered from any one side of sides of the first surface and of the second surface of the glass plate to another side of the sides of the first surface and of the second surface of the glass plate.
3. The semiconductor device according to claim 1,
wherein the glass plate has another opening portion penetrating through the glass plate between the first surface of the glass plate and the second surface of the glass plate,
wherein the wiring substrate further includes another resin portion penetrating through the glass plate between the first surface of the glass plate and the second surface of the glass plate, said another resin portion being positioned inside said another opening portion, and having another through wiring penetrating through said another resin portion between the first surface of the glass plate and the second surface of the glass plate.
4. The semiconductor device according to claim 1,
wherein the glass plate has another opening portion penetrating through the glass plate between the first surface of the glass plate and the second surface of the glass plate, and
the resin portion is positioned inside the other opening portion,
wherein the wiring substrate includes another resin portion penetrating through the glass plate between the first surface of the glass plate and the second surface of the glass plate, and
the space portion formed between the inner side surface of the opening portion and the side surface of the semiconductor chip is filled with said another resin portion.

5. The semiconductor device according to claim 4,
wherein a part of the resin portion positioned inside the other opening portion is exposed from a side surface of the glass plate.

6. The semiconductor device according to claim 1,
wherein the through wiring includes a signal transmitting portion and a shield portion surrounding the signal transmitting portion while interposing an insulating material between the signal transmitting portion and the shield portion.

7. A wiring substrate comprising:
a glass plate having a first surface and a second surface opposite to the first surface, the glass plate having an opening portion penetrating through the glass plate between the first surface of the glass plate and the second surface of the glass plate;
a resin portion having a first end face and a second end face opposite to the first end face, the resin portion penetrating through the glass plate between the first surface of the glass plate and the second surface of the glass plate; and
a plurality of through wirings penetrating through the resin portion between the first surface of the glass plate and the second surface of the glass plate to electrically connect a first wiring layer formed on a side of the first surface of the glass plate with a second wiring layer formed on a side of the second surface of the glass plate,
wherein the first surface of the glass plate and the first end face of the resin portion are aligned on a common plane, and
the second surface of the glass plate and the second end face of the resin portion are aligned on another common plane,
wherein the resin portion is positioned inside the opening portion.

8. The wiring substrate according to claim 7,
wherein an inner side surface of the opening portion is tapered from any one side of sides of the first surface and of the second surface of the glass plate to another side of the sides of the first surface and of the second surface of the glass plate.

9. A semiconductor device comprising:
a wiring substrate; and
a semiconductor chip,
wherein the wiring substrate includes
a glass plate whose thickness is equal to a thickness of the semiconductor chip, the glass plate having a first surface and a second surface opposite to the first surface, the glass plate having an opening portion and another opening portion each penetrating through the glass plate between the first surface of the glass plate and the second surface of the glass plate,
a resin portion penetrating through the glass plate between the first surface of the glass plate and the second surface of the glass plate,
a through wiring penetrating through the resin portion between the first surface of the glass plate and the second surface of the glass plate to electrically connect a first wiring layer formed on a side of the first surface of the glass plate with a second wiring layer formed on a side of the second surface of the glass plate,
another resin portion penetrating through the glass plate between the first surface of the glass plate and the second surface of the glass plate, said another resin portion being positioned inside said another opening portion, and
a plurality of other through wirings penetrating through said another resin portion between the first surface of the glass plate and the second surface of the glass plate, said plurality of other through wirings being arranged inside said another opening portion,
wherein the semiconductor chip is accommodated inside the opening portion,
a space portion formed between an inner side surface of the opening portion and a side surface of the semiconductor chip is filled with the resin portion, and
the resin portion is positioned inside the opening portion.

10. The semiconductor device according to claim 9,
wherein the inner side surface of the opening portion is tapered from any one side of sides of the first surface and of the second surface of the glass plate to another side of the sides of the first surface and of the second surface of the glass plate.

11. The semiconductor device according to claim 9,
wherein the through wiring includes a signal transmitting portion and a shield portion surrounding the signal transmitting portion while interposing an insulating material between the signal transmitting portion and the shield portion.

* * * * *